United States Patent [19]

Sawada

[11] Patent Number: 6,049,488
[45] Date of Patent: Apr. 11, 2000

[54] CLOCK SYNCHRONOUS SEMICONDUCTOR MEMORY DEVICE CAPABLE OF PREVENTING OUTPUTTING OF INVALID DATA

[75] Inventor: Seiji Sawada, Hyogo, Japan

[73] Assignee: Mitsubishi Denki Kabushiki Kaisha, Tokyo, Japan

[21] Appl. No.: 09/122,762

[22] Filed: Jul. 27, 1998

[30] Foreign Application Priority Data

Jan. 23, 1998 [JP] Japan ................................. 10-011046

[51] Int. Cl.[7] ...................................................... G11C 7/00
[52] U.S. Cl. ...................................... 365/189.05; 365/194
[58] Field of Search ........................... 365/189.05, 189.11, 365/194, 189.01

[56] References Cited

U.S. PATENT DOCUMENTS

| | | | |
|---|---|---|---|
| 5,535,171 | 7/1996 | Kim et al. ............................ | 365/189.05 |
| 5,557,582 | 9/1996 | Kawamoto .......................... | 365/189.05 |
| 5,798,969 | 8/1998 | Yoo et al. ............................ | 365/189.05 |
| 5,896,323 | 4/1999 | Park et al. ........................... | 365/189.05 |

FOREIGN PATENT DOCUMENTS 7-262777  10/1995  Japan .

*Primary Examiner*—Tan T. Nguyen
*Attorney, Agent, or Firm*—McDermott, Will & Emery

[57] ABSTRACT

A gate circuit is turned on in synchronization with an internal clock signal at a timing faster than activation of an output buffer circuit, and internal data is transmitted from the gate circuit to an output buffer circuit externally outputting data. Generation of an internal clock signal is stopped at a timing faster than deactivation of the output buffer circuit, and the gate circuit is set to the latching state. According such arrangement, output of invalid data is prevented.

20 Claims, 22 Drawing Sheets

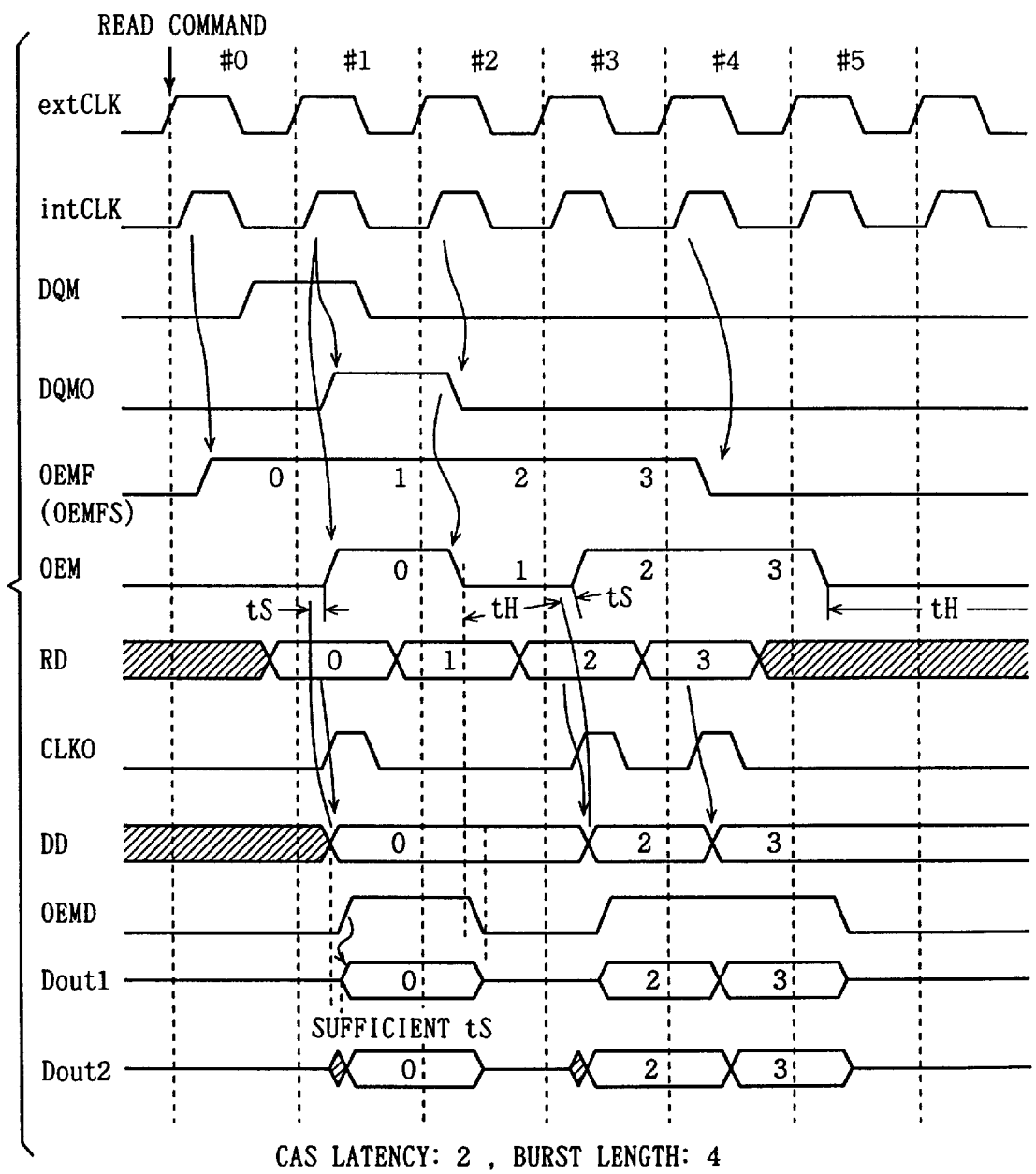

CAS LATENCY: 2, BURST LENGTH: 4

CAS LATENCY: 2 , BURST LENGTH: 4

BURST LENGTH: 4

CAS LATENCY: 2 , BURST LENGTH: 4

CLOCK SYNCHRONOUS SEMICONDUCTOR MEMORY DEVICE CAPABLE OF PREVENTING OUTPUTTING OF INVALID DATA

BACKGROUND OF THE INVENTION

1. Field of the Invention

The present invention relates to a semiconductor memory device, and in particular a synchronous semiconductor memory device operating in synchronization with a clock signal. More particularly, the invention relates to a control circuit for data output of the synchronous semiconductor memory device, and specifically relates to a structure for preventing output of invalid data.

2. Description of the Background Art

FIG. 21 is a timing chart representing an operation in data reading of a synchronous semiconductor memory device in the prior art. The operation of the synchronous semiconductor memory device will be described below with reference to FIG. 21.

This synchronous semiconductor memory device performs take-in of an externally supplied control signal and output of data in synchronization with an externally supplied clock signal extCLK such as a system clock. At a rising edge of external clock signal extCLK in clock cycle #1, a row address strobe signal /RAS is set to L level, and a column address strobe signal /CAS and a write enable signal /WE are set to H-level. A combination of states of these control signals is called an active command, which instructs the synchronous semiconductor memory device to perform row selection in accordance with a currently applied address signal. When a so-called RAS-CAS delay time of a standard DRAM elapses, an internal column selection is allowed.

At the rising edge of external clock signal extCLK in clock cycle #3, row address strobe signal /RAS and write enable signal /WE are set to H-level, and column address strobe signal /CAS is set to L-level. A combination of these states of control signals is called a read command, which instructs the device to perform the column selection in accordance with a currently applied address signal, and data is read from the selected memory cell.

In the data read operation, the column selection is internally performed, and data of the selected memory cell on the selected column is externally read out, and therefore a time is required for internal data transfer. Initial data is output in clock cycle #4, and output data Dout is made definite at the rising edge of external clock signal extCLK in clock cycle #5. Thereafter, column address signals are internally produced in accordance with a predetermined sequence to perform the column selection, of which start address is designated by the externally applied address signal, and data reading is continuously performed. At each of the rising edges of external clock signal extCLK in clock cycles #6, #7 and #8, data is made definite and is sampled by an external device.

The number of clock cycles from application of the read command to appearance of valid data is called a CAS latency. The number of data per data output terminal, which are successively read in response to one read command, is called a burst length. FIG. 21 shows by way of example the read operation performed with the CAS latency of 2 and the burst length of 4.

At the rising edge of external clock signal extCLK in clock cycle #9, row address strobe signal /RAS and write enable signal /WE are set to L-level, and column address strobe signal /CAS is set to H-level. A combination of these states of control signals is called a precharge command, which instructs precharging of the array. Thus, the selected row is internally driven to the unselected state, and the memory cell array returns to a predetermined precharged state so that the synchronous semiconductor memory device enters the standby state.

As shown in FIG. 21, the device takes in the external signal in synchronization with external clock signal extCLK so that a definite timing of each control signal is determined with respect to external clock signal extCLK, and it is not necessary to take into account a timing margin for a skew of each control signal or the like. Therefore, the internal operation can be performed at fast timings, and fast access is allowed. Also, fast data transfer is allowed because data Dout is output in synchronization with external clock signal extCLK.

FIG. 22 schematically shows a structure of a portion of the synchronous semiconductor memory device related to data reading in the prior art. In FIG. 22, the synchronous semiconductor memory device in the prior art shown in FIG. 22 includes a memory cell array 900 having a plurality of memory cells arranged in rows and columns, an address input buffer 902 which takes in an externally applied address signal in synchronization with the clock signal and produces internal row and column address signals, a row select circuit 904 which drives the addressed row (word line) in memory cell array 900 to the selected state in accordance with the internal row address signal received from address input buffer 902, a column select circuit 906 for selecting the addressed column (bit line pair) in memory cell array 900 in accordance with the internal column address signal received from address input buffer 902, a read circuit 908 for reading data of the memory cell on the column selected by column select circuit 906 in the data read operation, an output circuit 910 which receives and buffers read data RD supplied from read circuit 908 in synchronization with an internal clock signal CLKO for producing external data Dout when activated, a clock buffer 912 for buffering externally applied clock signal extCLK to produce internal clock signals intCLK and CLKO, a command decoder 914 for determining logical states of externally supplied control signals /RAS, /CAS and /WE in synchronization with internal clock signal intCLK, to produce a signal representing result of the determination, and a control circuit 916 for performing an operation instructed according to the output signal of command decoder 914.

Control circuit 916 includes a row-related control circuit 916a which is activated upon reception of an operation mode instruction (the active command and the precharge command) related to the row selection from command decoder 914, and controls operations of circuits related to the row selection, a column-related control circuit 916b which is activated upon reception of instructions (the read command and a write command instructing data writing) related to the column selection from command decoder 914, and to control operations of circuits related to the column selection, and an output control circuit 916c which activates output circuit 910 in accordance with a read enable signal OEMF received from column-related control circuit 916b. When an output enable signal (i.e., output buffer enable signal) OEM from output control circuit 916c is activated, output circuit 910 is activated to generate data Dout in synchronization with internal clock signal CLKO.

Row-related control circuit 916a controls address input buffer 902 and row select circuit 904 as well as a bit line precharge circuit and a sense amplifier circuit, which are not shown in the figure, but it is shown controlling only row select circuit 904 in FIG. 22. Column-related control circuit 916b activates read enable signal OEMF when an access command (the read command) is applied. While read enable signal OEMF is active, the column selection and the reading of internal data are performed. Column select circuit 906 includes a column decoder and I/O gates for connecting the selected column to the internal data line. Read circuit 908 includes a preamplifier circuit for amplifying the data on the internal data line. The read circuit may include a transfer gate, which transfers the output signal of the preamplifier circuit in synchronization with internal clock signal intCLK, as necessary according to the internal structure.

Output circuit 910 includes a gate circuit for taking in read data RD applied from read circuit 908 in synchronization with internal clock signal CLKO, and an output buffer which in turn buffers and outputs the output signal of this gate circuit when output enable signal OEM is active. Column-related control circuit 916b determines a timing for taking the column address into the address input buffer 902, but this operation is not shown in FIG. 22 for simplicity purpose.

FIG. 23 shows an example of a structure of clock buffer 912 shown in FIG. 22. In FIG. 23, clock buffer 912 includes a buffer circuit 912a for buffering external clock signal extCLK and producing internal clock signal intCLK, and a buffer circuit 912b for buffering external clock signal extCLK and producing internal clock signal CLKO for reading. Internal clock signal intCLK and internal clock signal CLKO for reading are synchronized with each other, and are always generated (if a clock enable signal is not used).

FIG. 24 shows an example of a structure of an OEMF signal generating circuit included in column-related control circuit 916b shown in FIG. 22. In FIG. 24, the OEMF signal generating circuit includes a burst length counter 920a which operates in synchronization with internal clock signal intCLK to delay a data read instructing signal /READ by a burst length time, an NAND circuit 920b which receives data read instructing signal /READ on one of its two inputs, and an NAND circuit 920c which receives a reset signal /RST from burst length counter 920a and the output signal of NAND circuit 920b. NAND circuit 920b receives the output signal of NAND circuit 920c, and generates read enable signal OEMF. Read instructing signal /READ attains L-level, i.e., the active state for a predetermined period when the read command is applied. Burst length counter 920a operates in synchronization with internal clock signal intCLK to shift read instructing signal /READ for the burst length period, and activates reset signal /RST after elapsing of the burst length period. An operation of the OEMF signal generating circuit shown in FIG. 24 will be described below with reference to a timing chart of FIG. 25.

When a read command is applied at the rising edge of external clock signal extCLK, command decoder 914 shown in FIG. 22 detects this application of the read command in synchronization with internal clock signal intCLK, and drives read instructing signal /READ to the active state of L-level for a predetermined period. In response to the activation of read instructing signal /READ, read enable signal OEMF from NAND circuit 920b attains the active state of L-level. Reset signal /RST is at H-level, and NAND circuit 920c receives signals at H-level on both inputs, and drives its output signal to L-level. Thereby, read enable signal OEMF maintains the active state of H-level even when read instructing signal /READ rises to H-level. While this read enable signal OEMF is active, selection of the memory cell column and reading of data from the selected memory cell are performed under the control by column-related control circuit 916b.

The burst length counter 920a, which counts the burst length period in synchronization with internal clock signal intCLK (FIG. 25 shows the operation with the burst length of 4), drives the reset signal /RST to the active state of L-level for a period of one clock cycle when four clock cycles (burst length period) elapses after application of the read command. When the reset signal /RST falls to L-level, the output signal of NAND circuit 920c attains H-level, and NAND circuit 920b which receives the signals at H-level on both inputs drives read enable signal OEMF to L-level. Thereby, the output signal of NAND circuit 920c is fixed to H-level, and read enable signal OEMF maintains the inactive state even when reset signal /RST returns to H-level.

By keeping read enable signal OEMF active only for the burst length period, data of the burst length is read.

FIG. 26 shows by way of example structures of output control circuit 916c and output circuit 910 shown in FIG. 22. In FIG. 26, output control circuit 916c includes a (CAS latency−1) clock shifter 916ca delaying read enable signal OEMF, which is generated from column-related control circuit 916b shown in FIG. 22, by (CAS latency−1) clock cycle(s) of internal clock signal intCLK. (CAS latency−1) clock shifter 916ca performs a shifting operation in synchronization with internal clock signal intCLK, and produces output enable signal (output buffer enable signal) OEM by delaying read enable signal OEMF by a period of (CAS latency−1) clock cycle(s).

Output circuit 910 includes a gate circuit 910a which operates in synchronization with internal clock signal CLKO to take in and latch the internal read data from read circuit 908 shown in FIG. 22, and an output buffer circuit 910b which is activated when output enable signal OEM is active, and externally outputs data DD latched by gate circuit 910a.

Gate circuit 910a includes a tristate inverter buffer 910aa which is activated to invert internal read data RD when internal clock signal CLKO is at H-level, an inverter circuit 910ab which inverts the output signal of tristate inverter buffer 910aa and applies internal data DD to output buffer circuit 910b, and an inverter circuit 910ac which inverts and transmits output data DD of inverter circuit 910ab to an input of inverter circuit 910ab. Inverter circuits 910ab and 910ac form an inverter latch.

Output buffer circuit 910b includes an inverter circuit 910ba inverting data DD, an AND circuit 910bb receiving output enable signal OEM and data DD, an AND circuit 910bc receiving the output signal of inverter 910ba and output enable signal OEM, an n-channel MOS transistor 910bd which is turned on to produce output data Dout at a power supply voltage Vcc level when the output signal of AND circuit 910bb is at H-level, and an n-channel MOS transistor 910be which is turned on to produce output data Dout at a ground voltage VSS level when the output signal of AND circuit 910bc is at H-level. Each of AND circuits 910bb and 910bc is generally formed of an NAND circuit and an inverter circuit. Now, operations of output control circuit 916c and output circuit 910 shown in FIG. 26 will be described below with reference to a timing chart of FIG. 27.

Internal clock signals intCLK and CLKO are generated in synchronization with external clock signal extCLK. Therefore, tristate inverter buffer 910aa of gate circuit 910a is always repetitively turned on and off, and repetitively takes in and latch internal read data RD.

When the read command is applied in clock cycle #0, read enable signal OEMF attains the active state of H-level in clock cycle #0. The following description will be given on the operation which is performed with the CAS latency of 2 and burst length of 4. In accordance with activation of read enable signal OEMF, a memory cell is selected and data is read from the selected memory cell under the control by column-related control circuit 916*b* (see FIG. 22).

In clock cycle #1, internal read data RD is taken into gate circuit 910*a* in response to the rising of internal clock signal CLKO, and is latched in response to the falling of internal clock signal CLKO. Since CAS latency is 2, output enable signal OEM from (CAS latency−1) clock shifter 916*ca* is activated in synchronization with internal clock signal intCLK in clock cycle #1. When output enable signal OEM attains the active state of H-level, output buffer circuit 910*b* is activated to attain the output low-impedance state, and operates to buffer and output the data applied from gate circuit 910*a*.

Since the burst length is 4, read enable signal OEMF is deactivated in clock cycle #4, and the reading operation of read circuit 908 (see FIG. 22) is disabled. Meanwhile, internal clock signal CLKO is always generated so that the operation of taking in and latching internal read data RD is repeated. In clock cycle #4, gate circuit 910*a* takes in the last burst length data in synchronization with the rising of internal clock signal CLKO, for latching in synchronization with the falling thereof.

After this last data of data of the burst length is output, output enable signal OEM is deactivated to attain L-level in clock cycle #5, and output buffer circuit 910*b* attains the output high-impedance state. Thereby, the data of burst length of 4 is successively output in synchronization with external clock signal extCLK.

A region hatched in the timing chart of FIG. 27 is a region of invalid data.

FIG. 28 shows another structure of a synchronous semiconductor memory device in the prior art. The synchronous semiconductor memory device shown in FIG. 28 differs from the synchronous semiconductor memory device shown in FIG. 22 in that the device shown in FIG. 28 has a function of masking the data output of output circuit 910. More specifically, the synchronous semiconductor memory device shown in FIG. 28 includes an internal mask instruction signal generating circuit 930, which is responsive to an externally applied data output mask instruction DQM to generate an internal mask instructing signal DQM0 to output control circuit 916*c* in synchronization with internal clock signal intCLK. Output control circuit 916*c* drives output enable signal OEM to the inactive state and sets output circuit 910 to the high-impedance state, when internal mask instructing signal DQM0 from internal mask instructing signal generating circuit 930 is active and indicates that the data output is to be masked. Structures other than the above are the same as those shown in FIG. 22, and the corresponding portions bear the same reference numerals.

FIG. 29 schematically shows a structure of internal mask instructing signal generating circuit 930 shown in FIG. 28. In FIG. 29, internal mask instructing signal generating circuit 930 includes an input buffer 930*a* which receives and buffers externally applied data mask instruction DQM, a one-shot pulse generating circuit 930*b* which generates a pulse signal of one shot in response to the rising of internal clock signal intCLK when the signal received from input buffer 930*a* is active, and a latch circuit 930*c* which latches a one-shot pulse signal DQM0F from one-shot pulse generating circuit 930*b* in synchronization with internal clock signal intCLK.

In the structure of internal mask instructing signal generating circuit 930 shown in FIG. 29, the data output in the next clock cycle is masked when externally applied mask instruction DQM becomes active.

FIG. 30 shows an example of the structure of one-shot pulse generating circuit 930*b* shown in FIG. 29. In FIG. 30, one-shot pulse generating circuit 930*b* includes an AND circuit 930*ba* receiving internal clock signal intCLK and output signal DQMi from the input buffer, an inversion/delay circuit 930*bb* which inverts the output signal of AND circuit 930*ba* and delays the same for a predetermined time, and an AND circuit 930*bc* which receives the output signal of AND circuit 930*b* and the output signal of inversion/delay circuit 930*bb*, and outputs signal DQM0F. Signal DQMi from input buffer 930*a* shown in FIG. 29 is at H-level when active. When the mask instruction is applied, the output signal of AND circuit 930*ba* rises to H-level in response to the rising of internal clock signal intCLK to H-level, and signal DQM0F attains the active state of H-level for a predetermined period.

The structure of the one-shot pulse generating circuit shown in FIG. 30 may be replaced with a set/reset flip-flop which is set when the output signal of AND circuit 930*ba* is at H-level, and is reset upon elapsing of a predetermined time. This set/reset flip-flop outputs signal DQM0F.

FIG. 31 shows an example of a structure of latch circuit 930*c* shown in FIG. 29. In FIG. 31, latch circuit 930*c* includes an inverter 930*ca* inverting signal DQM0F, an NAND circuit 930*cb* receiving internal clock signal intCLK and signal DQM0F, an NAND circuit 930*cc* receiving the output signal of inverter 930*ca* and internal clock signal intCLK, an NAND circuit 930*cd* receiving on one of its two inputs the output signal of NAND circuit 930*cb*, and an NAND circuit 930*ce* receiving the output signals of NAND circuits 930*cc* and 930*cd*. The output signal of NAND circuit 930*ce* is applied to the other input of NAND circuit 930*cd*. NAND circuit 930*cd* generates internal mask instructing signal DQM0.

In latch circuit 930*c* shown in FIG. 31, NAND circuits 930*cb* and 930*cc* operate as an inverter to pass signal DQM0F therethrough when internal clock signal intCLK is at H-level. NAND circuits 930*cd* and 930*ce* form a latch circuit, and latch the signals applied from NAND circuits 930*cd* and 930*cc*. When signal DQM0F becomes active, it is taken into this latch circuit in synchronization with internal clock signal intCLK, and is kept in the latched state for the current clock cycle. Now, an operation of internal mask instructing signal generating circuit 930 shown in FIGS. 29 through 31 will be described below with reference to a waveform diagram of FIG. 32.

In clock cycle #0, externally applied mask instructing signal DQM is driven to H-level, and is held at H-level at the rising edge of external clock signal extCLK in clock cycle #1. Internal clock signal intCLK is generated in synchronization with external clock signal extCLK, and signal DQM0F from one-shot pulse generating circuit 930*b* shown in FIG. 30 attains H-level for a predetermined period in response to the rising of internal clock signal intCLK. When internal clock signal intCLK is at H-level, latch circuit 930*c* takes in the applied signal. Therefore, signal DQM0F at H-level is taken into latch circuit 930*c*, and internal mask instructing signal DQM0 rises to H-level. While internal clock signal intCLK is at H-level, signal DQM0F holds H-level. When internal clock signal intCLK falls to L-level, the output signals of NAND circuits 930*cb* and 930*cc* attain H-level and latch circuit 930*c* attain the latch state.

In clock cycle #2, internal clock signal intCLK rises to H-level again. If externally supplied mask instruction DQM is low at the time of this rising, signal DQM0F from one-shot pulse generating circuit 930b is at L-level so that internal mask instructing signal DQM0 from latch circuit 930c is driven to L-level in synchronization with this rising of internal clock signal intCLK. Output enable signal OEM is deactivated in accordance with internal mask instructing signal DQM0. When the mask instruction is externally applied at the rising edge in clock cycle #1, data to be output in clock cycle #2 is masked.

FIG. 33 schematically shows a structure of output control circuit 916c shown in FIG. 28. In FIG. 33, output control circuit 916c includes a (CAS latency−2) clock shifter 940a which delays internal read enable signal OEMF from column-related control circuit 916b (see FIG. 28) by (CAS latency−2) clock cycle(s), an inverter 940b inverting internal mask instructing signal DQM0, an AND circuit 940c which receives the output signals of (CAS latency−2) clock shifter 940a and inverter 940b, and a one-clock shifter 940d which delays the output signal of AND circuit 940c by one clock cycle of internal clock signal intCLK. Output enable signal OEM is generated from one-clock shifter 940d.

Each of (CAS latency−2) clock shifter 940a and one-clock shifter 940d is a circuit which performs a shifting operation in synchronization with internal clock signal intCLK, and has the same basic structure as the latch circuit shown in FIG. 31.

The structure of the output circuit is the same as that shown in FIG. 26. The output circuit outputs the data in synchronization with internal clock signal intCLK when output enable signal OEM from one-clock shifter 940d is active.

FIG. 34 is a timing chart showing a data read sequence of the synchronous semiconductor memory device shown in FIG. 28. FIG. 34 shows the data read operation performed with the CAS latency of 2 and the burst length of 4. With the CAS latency of 2, (CAS latency−2) clock shifter 940a shown in FIG. 33 does not implement the delaying, so that read enable signal OEMF and output signal OEMFS of (CAS latency−2) clock shifter 940a are generated at the same timing. The data read operation of the synchronous semiconductor memory device shown in FIG. 28 will be described below with reference to FIGS. 28 to 34.

In clock cycle #0, the read command is applied. In accordance with this read command, read enable signal OEMF is driven to the active state of H-level in clock cycle #0, and is kept active for the burst length period. Concurrently, signal OEMFS from (CAS latency−2) clock shifter 940a is likewise driven to the active state of H-level. In accordance with read enable signal OEMF, selecting the column of memory cells and reading the internal data are internally performed.

At the rising edge of clock signal extCLK in clock cycle #1, externally applied mask instructing signal DQM is set to H-level to provide the instruction for masking the data output. In response to this data output mask instruction, internal mask instructing signal DQM0 rises to H-level for one clock cycle period in clock cycle #1, and the output signal of inverter 940b shown in FIG. 33 attains L-level. Output enable signal OEM becomes active in clock cycle #1. Even if internal mask instructing signal DQM0 is activated, this signal is applied to one-clock shifter 940d shown in FIG. 33 so that output enable signal OEM keeps the active state in clock cycle #1. Thereby, the output circuit produces and externally outputs internal read data DD in accordance with read data RD which is internally read by the read circuit.

In clock cycle #2, output enable signal OEM from one-clock shifter 940d shown in FIG. 33 attains the inactive state of L-level for one clock cycle period in accordance with internal mask instructing signal DQM0 so that the output circuit attains the output high-impedance state. Although internal read data RD is transferred in the output circuit, it is not externally output, and the data output is masked.

Data output mask instruction DQM is activated only at the rising edge of external clock signal extCLK in clock cycle #1. In clock cycles #2, #3 and #4, therefore, internal mask instructing signal DQM0 becomes inactive again so that, in clock cycles #3 and #4, output enable signal OEM attains the active state of H-level again, and the output circuit produces and externally outputs internal read data DD in accordance with internal read data RD.

As shown in FIG. 34, data output mask instruction DQM is activated in clock cycle #1 so that data output in the second clock cycle can be masked. Thereby, the external processor can take in only necessary data.

In the structures of the output control circuit and output circuit shown in FIG. 26, invalid data is output as can be seen from Dout2 in FIG. 27, if internal data DD from the gate circuit is not definite, i.e., if setup time tS of internal data DD with respect to output enable signal OEM is insufficient when output enable signal OEM changes from L-level to H-level. If setup time tS of internal data DD with respect to the rising of output enable signal OEM is sufficiently long and internal data DD is already definite at the time of activation of output enable signal OEM, invalid data is not output as the leading data, as can be seen from output data Dout1 in FIG. 27.

When output enable signal OEM is deactivated and changes from H-level to L-level, internal data DD must hold the fixed state. Thus, invalid data would be contained in output data Dout1 as shown in FIG. 27, if hold time tH of internal data DD with respect to the deactivation of output enable signal OEM is short. If hold time tH is sufficiently long, invalid data is not output as can be seen from output data Dout2 in FIG. 27.

Internal data DD is taken into the output circuit in synchronization with internal clock signal CLKO, and output enable signal OEM is also changes in synchronization with internal clock signal intCLK. These internal clock signals CLKO and intCLK are produced from external clock signal extCLK, and are synchronized with each other. Therefore, these output enable signal OEM and internal data DD change substantially at the same timings so that it is difficult to increase sufficiently both setup time tS and hold time tH. Therefore, the timings for generating internal data DD and output enable signal OEM are entirely shifted from each other. As a result, output enable signal OEM merely shifts forward or back with respect to internal data DD and, therefore, either setup time tS or hold time tH decreases so that output data Dout1 or Dout2 shown in FIG. 27 is obtained as the output data, and it is difficult to eliminate the invalid data.

If this invalid data satisfies specification values relating to the setup and hold times of output data Dout with respect to external clock signal extCLK as well as the access time (i.e., time from application of the read command to reading of valid data), no problem substantially arises because this invalid data is not sampled in the data processing, and valid data is correctly sampled. If the invalid data is output, however, output data Dout changes in a short period so that power supply noises occurs in the output circuit, and may cause a malfunction. Particularly, if the power supply noises occur on the system power supply, an operation power supply voltage changes in a processor sampling the data, resulting in malfunctions (e.g., failure in determination of high/low levels, and a malfunction of a circuit due to deviation of input and output timings of data from each other). Therefore, data processing cannot be performed accurately, and it is impossible to construct the system which can operate accurately. If such invalid data occurs, it is necessary to determine the access time in consideration of a margin for the invalid data, resulting in a problem that the access time cannot be reduced.

If the output control circuit shown in FIG. 33 is used for data output, problems related to output enable signal OEM arise due to the setup and hold times for the leading data and the last burst data, as already discussed with reference to FIG. 27, as well as due to the data mask.

As shown in FIG. 31, internal data mask instructing signal DQM0 changes in synchronization with internal clock signal intCLK. Therefore, output enable signal OEM also changes in synchronization with internal clock signal intCLK. Therefore, a problem arises in the setup and hold times with respect to deactivation and activation of the output enable signal at the time when the data mask instruction is applied.

As shown in FIG. 34, if hold time tH of internal data DD(0) is short with respect to deactivation of output enable signal OEM in clock cycle #2, invalid data occurs at the time of data output masking (output data Dout1). If setup time tS of third data DD(2) is short at the time of activation of output enable signal OEM in clock cycle #3, invalid data is likewise output as can be seen from output data Dout2 in FIG. 34. Therefore, the invalid data is output when the data output is to be masked, and a malfunctions occurs in circuits due to power supply noises and others.

SUMMARY OF THE INVENTION

An object of the invention is to provide a synchronous semiconductor memory device including an output circuit which can reliably prevent output of invalid data.

Another object of the invention is to provide an output control circuit which can sufficiently ensure a setup time and a hold time of internal data with respect to an output enable signal.

In summary, a semiconductor memory device according to the invention has a structure for transmitting only valid data to an output buffer circuit. Thus, a gate circuit transmitting internal read data to the output buffer circuit is turned on only for a necessary period.

More specifically, a semiconductor memory device according to the invention includes a plurality of memory cells, a gate circuit for passing therethrough data of a selected memory cell among the plurality of memory cells in a data read mode, an output circuit for externally outputting the data applied from the gate circuit when data output is enabled, and an output control circuit for making conductive the gate circuit in synchronization with a clock signal. The output control circuit includes means for making nonconductive the gate circuit independently of the clock signal in response to disabling of the data output.

In the data output disabled state, i.e., when output of data from the output circuit is disabled, the gate circuit for transmitting the read data to the output circuit is turned off independently of the clock signal to prohibit transmission of the data. Thereby, only the data to be output is transmitted to the output circuit, and external output of invalid data can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a timing chart representing an operation of the circuit shown in FIG. 5;

DESCRIPTION OF THE PREFERRED EMBODIMENTS

Embodiment 1

Figure 1:
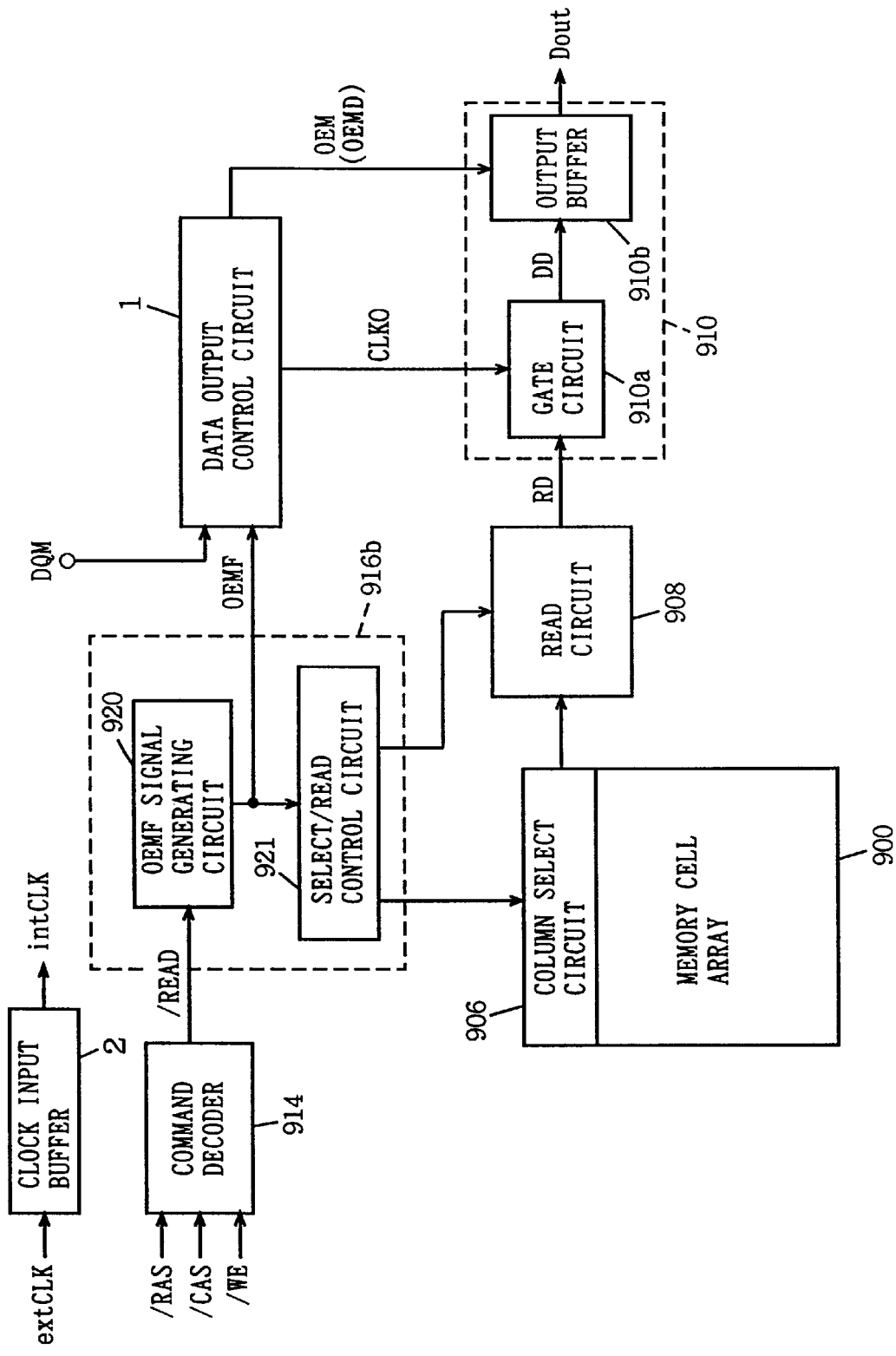
FIG. 1 schematically shows a whole structure of a semiconductor memory device according to an embodiment 1 of the invention.
Figure 26:
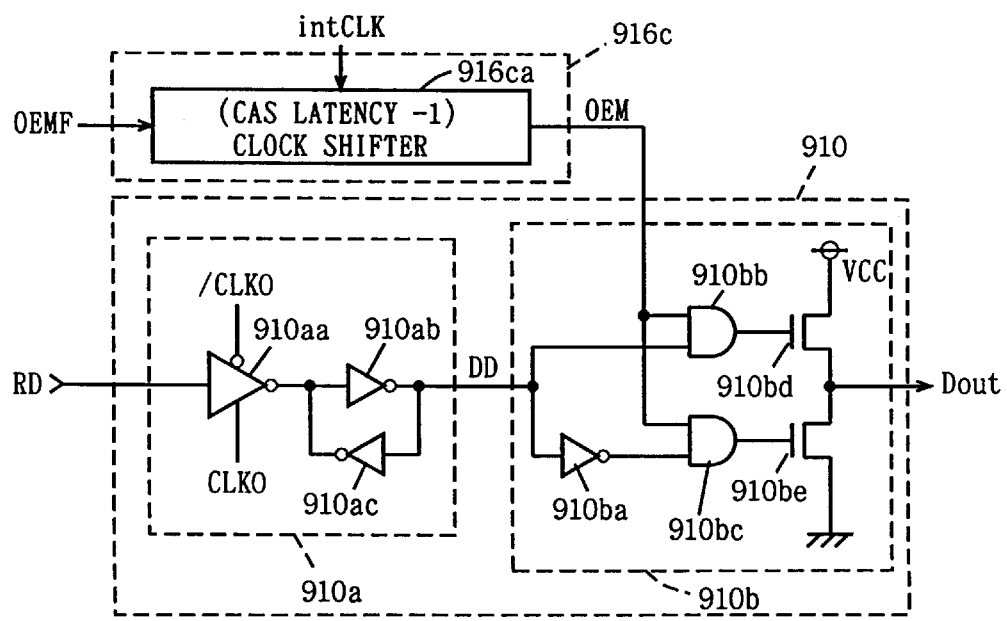
FIG. 26 schematically shows a structure of an output control circuit and an output circuit shown in FIG. 22.
Figure 27:
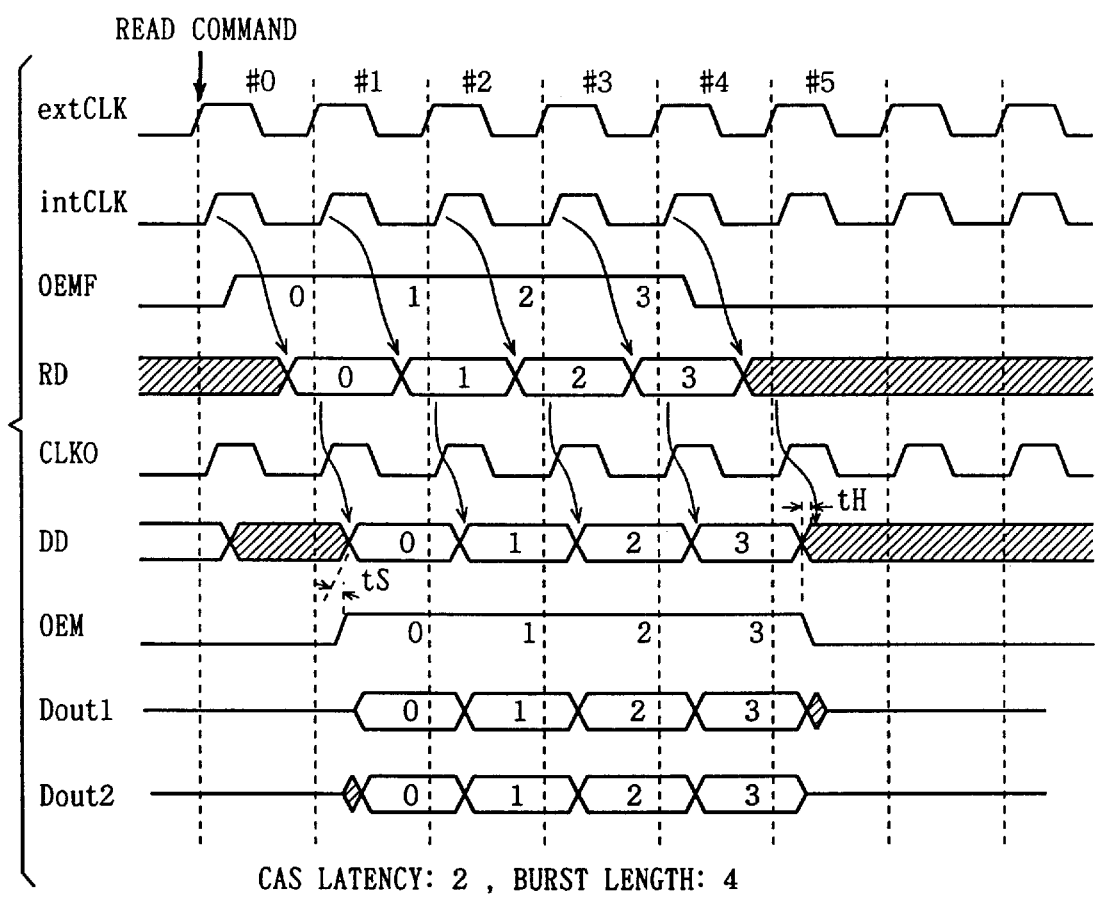
FIG. 27 is a timing chart representing an operation of the circuit shown in FIG. 26.
Figure 28:
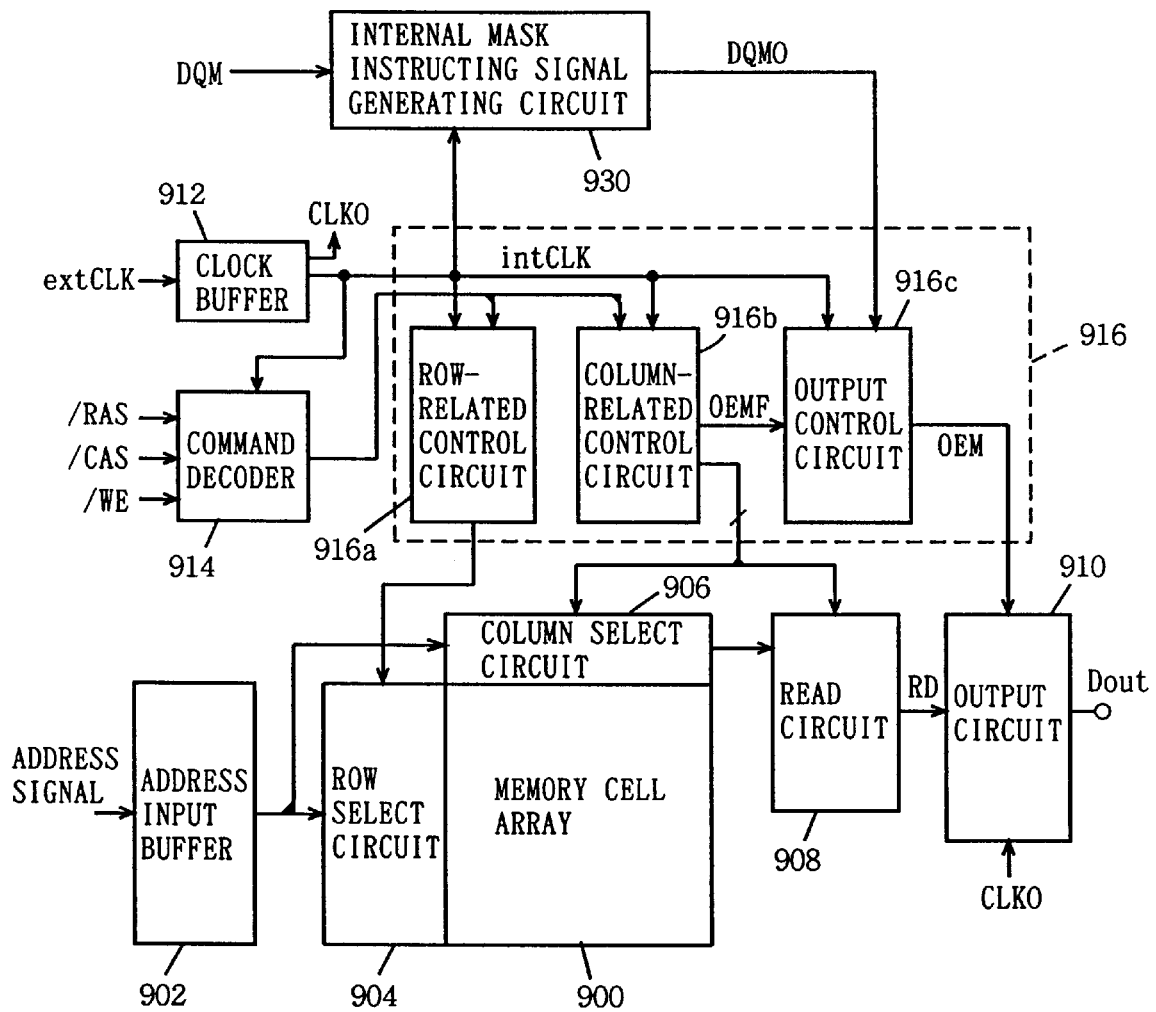
FIG. 28 schematically shows another structure of the semiconductor memory device in the prior art.

FIG. 1 schematically shows a structure of a data read portion of a synchronous semiconductor memory device according to an embodiment 1 of the invention. Similarly to the prior art, the synchronous semiconductor memory device shown in FIG. 1 includes a memory cell array 900, a column select circuit 906 for selecting an addressed column in memory cell array 900, a read circuit 908 for reading data of a memory cell selected by column select circuit 906, and an output circuit 910 for externally outputting, as output data Dout, internal read data RD from read circuit 908. Similarly to the structure shown in FIG. 26, output circuit 910 includes a gate circuit 910a which is turned on to produce internal data DD from internal read data RD in response to a clock signal, and an output buffer 910b which buffers internal data DD to produce output data Dout.

The synchronous semiconductor memory device further includes a clock input buffer 2 which receives external clock signal extCLK and produces internal clock signal intCLK synchronized with external clock signal extCLK, a command decoder 914 which receives externally supplied control signals /RAS, /CAS and /WE, and determines logical states of these control signals at the rising edge of internal clock signal intCLK to identify the applied command, and a column-related control circuit 916b which controls the column selecting operation in accordance with internal read instructing signal /READ from command decoder 914.

Figure 24:
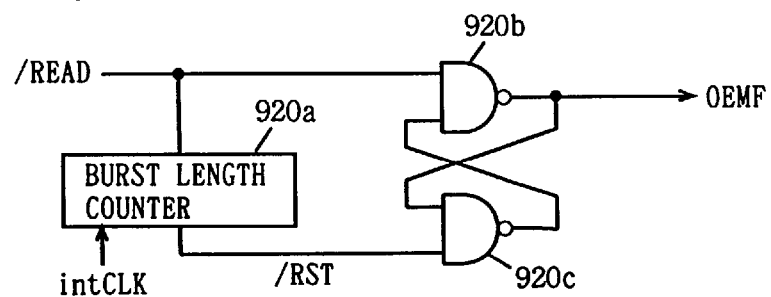
FIG. 24 schematically shows a structure of a portion generating a signal OEMF shown in FIG. 22.
Figure 25:
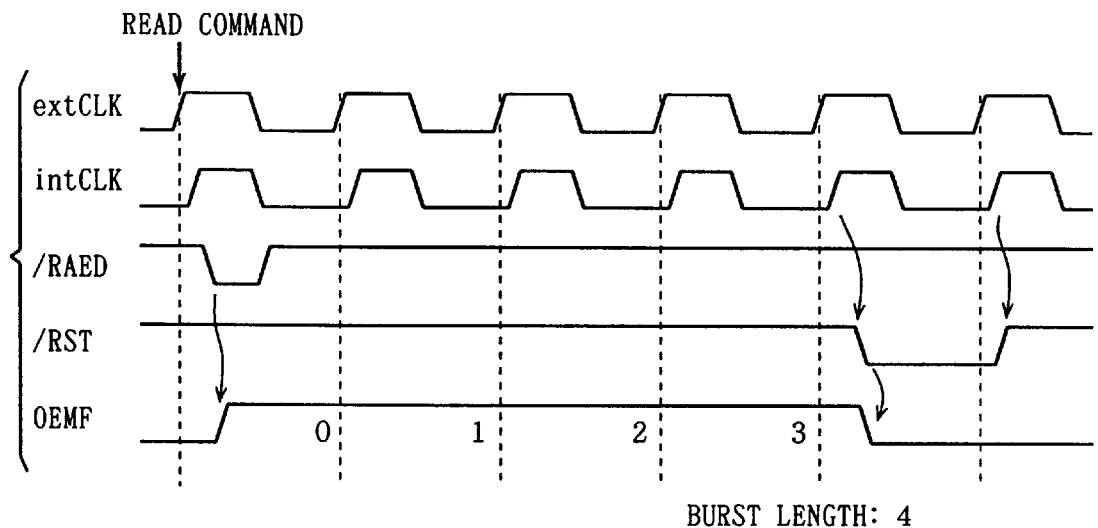
FIG. 25 is a timing chart showing an operation of the circuit shown in FIG. 24.

The column-related control circuit 916b includes an OEMF signal generating circuit 920 for generating a signal OEMF, which becomes active for a burst length period, in accordance with internal read instructing signal /READ from command decoder 914, and a select/read control circuit 921 which is activated in response to activation of signal OEMF, to control operation of column select circuit 906 and read circuit 908. OEMF signal generating circuit 920 has the same structure as that shown in FIG. 24.

The synchronous semiconductor memory device further includes a data output control circuit 1, which receives signal OEMF from OEMF signal generating circuit 920 and externally supplied data output mask instruction DQM, and produces internal clock signal intCLKO for data output and output enable signal OEM. Data output control circuit 1 applies output enable signal (output buffer enable signal) OEM to output buffer 910b included in output circuit 910, and applied internal clock signal intCLKO for output to gate circuit 910a.

Data output control circuit 1 turns off gate circuit 910a to prohibit internal read data RD received from read circuit 908 from being transmitted to output buffer 910b when the data output is masked, and when the state of output enable signal OEM changes into the disabled state. When output enable signal OEM is active, gate circuit 910a is driven to the on state at a timing earlier than the activation of output buffer circuit 910b. Thereby, external output of invalid data due to transmission of unnecessary data is prevented, as will be described later. Structures of various portions will now be described below.

[Clock Input Buffer]

Figure 2A:
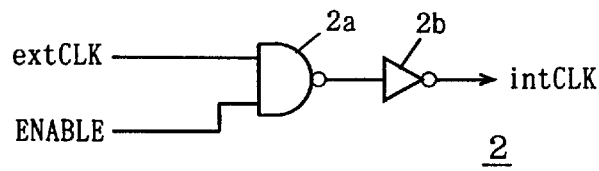
FIG. 2A shows an example of a structure of a clock input buffer shown in FIG. 1.

FIG. 2A shows an example of a structure of clock input buffer 2 shown in FIG. 1. In FIG. 2A, clock input buffer 2 includes a NAND circuit 2a receiving externally supplied clock signal extCLK and clock enable signal ENABLE, and an inverter circuit 2b inverting the output signal of NAND circuit 2a and producing internal clock signal intCLK. Clock enable signal ENABLE may be either an externally applied clock enable signal or a signal which is internally generated when a specific operation mode (e.g., power-down mode) is designated.

Figure 2B:
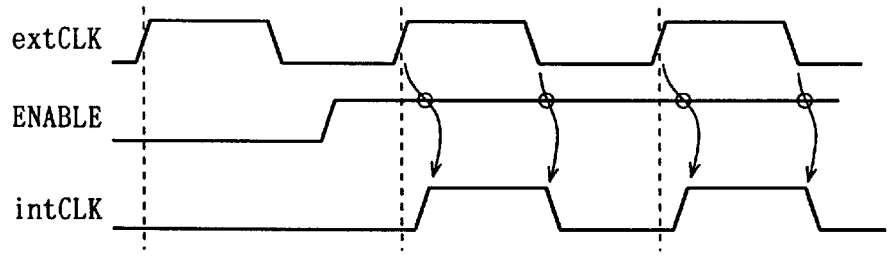
FIG. 2B is a signal waveform diagram representing an operation of the circuit shown in FIG. 2A.

In the structure of clock input buffer 2 shown in FIG. 2A, when clock enable signal ENABLE is at L-level and inactive, the output signal of NAND circuit 2a is fixed to H-level, and internal clock signal intCLK is fixed to L-level, as shown in FIG. 2B. Therefore, the internal circuits do not start new operations, and maintain the last states while clock enable signal ENABLE is inactive. Thus, internal circuits do not operate, and charging and discharging of signal lines are not performed so that a current consumption is reduced. While the synchronous semiconductor memory device is in a mode such as a power-down mode or a sleep mode, and is kept on standby for a long time, clock enable signal ENABLE is kept inactive for reducing the current consumption.

When clock enable signal ENABLE rises to H-level, NAND circuit 2a operates as an inverter, and internal clock signal intCLK is produced according to external clock signal extCLK. [Clock Input Buffer 2]

Figure 3A:
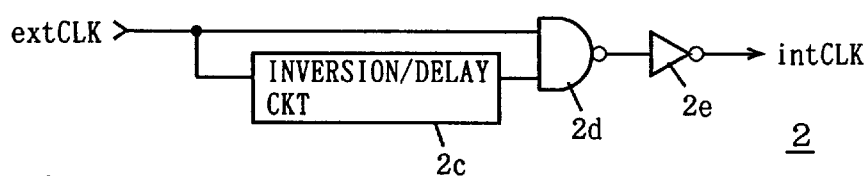
FIG. 3A shows another example of a structure of the clock input buffer shown in FIG. 1.

FIG. 3A shows another structure of the clock input buffer shown in FIG. 1. In FIG. 3A, clock input buffer 2 includes an inversion/delay circuit 2c for delaying external clock signal extCLK by a predetermined time and inverting the same, a NAND circuit 2d receiving external clock signal extCLK and the output signal of inversion/delay circuit 2c, and an inverter 2e which inverts the output signal of NAND circuit 2d and produces internal clock signal intCLK. The inversion/delay circuit 2c has the delay time shorter than a period for which external clock signal extCLK is at H-level.

Figure 3B:
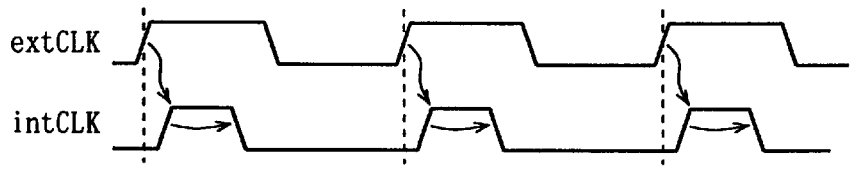
FIG. 3B shows an operation waveform thereof.

As shown in a waveform diagram of FIG. 3B, when external clock signal extCLK rises to H-level, the output signal of inversion/delay circuit 2c is still at H-level in clock input buffer 2 shown in FIG. 3A, and the output signal of NAND circuit 2d attains L-level so that inverter circuit 2e drives internal clock signal intCLK to H-level. When the delay time of inversion/delay circuit 2c elapses, the output signal of inversion/delay circuit 2c lowers to L-level so that the output signal of NAND circuit 2d attains H-level, and internal clock signal intCLK attains L-level.

In the structure of clock input buffer 2 shown in FIG. 3, internal clock signal intCLK is formed of a signal synchronized with external clock signal extCLK and having a constant pulse width. Accordingly, even the pulse width of external clock signal extCLK varies due to an influence of noises, internal clock signal intCLK has a constant pulse width, and circuits which operate in synchronization with internal clock signal. intCLK can operate accurately without an influence of noises on external clock signal extCLK.

[Clock Input Buffer 3]

Figure 4A:
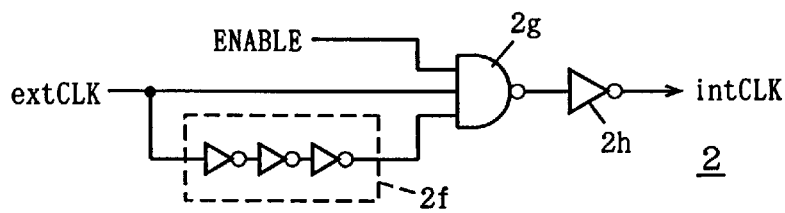
FIG. 4A shows still another structure of the clock input buffer show in FIG. 1.

FIG. 4A shows another structure of the clock input buffer. In FIG. 4A, clock input buffer 2 has an inversion/delay circuit 2f which is formed of odd number of stages of inverters for delaying external clock signal extCLK by a predetermined time and inverting the same, a NAND circuit 2g which receives clock enable signal ENABLE, external clock signal extCLK and the output signal of inversion/delay circuit 2f, and an inverter circuit 2h which inverts the output signal of NAND circuit 2g to produce internal clock signal intCLK. Inverting and delaying circuit 2f has the delay time shorter than a period during which external clock signal extCLK is at H-level.

Figure 4B:
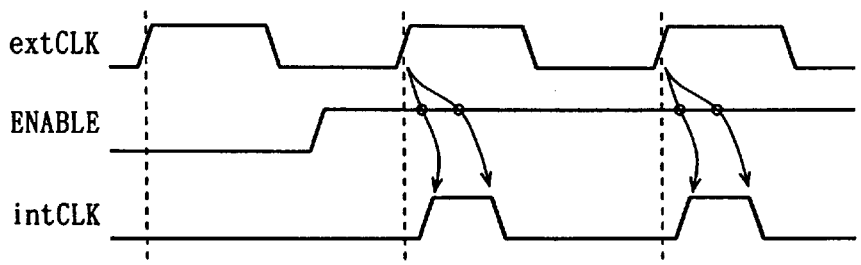
FIG. 4B shows an operation waveform thereof.

In the structure of the clock input buffer shown in FIG. 4A, when clock enable signal ENABLE is at L-level, the output signal of NAND circuit 2g is fixed to H-level, and internal clock signal intCLK is fixed to L-level, as shown in an operation waveform diagram of FIG. 4B. In this state, the internal circuits stop the operation.

When clock enable signal ENABLE rises to H-level, internal clock signal intCLK rises to H-level in synchronization with the rising of external clock signal extCLK, similarly to the clock input buffer shown in FIG. 3A. When the delay time of inversion/delay circuit 2f elapses, internal clock signal intCLK lowers to L-level. In the structure of the clock input buffer shown in FIG. 4A, therefore, the operation of internal circuits likewise stop in accordance with clock enable signal ENABLE to reduce the current consumption. Since the internal clock signal intCLK having a constant pulse width is generated, the operation timing of the internal circuits can be made constant.

Any of the structures of clock input buffers shown in FIGS. 2A, 3A and 4A may be employed. Alternatively, a buffer circuit which merely buffers external clock signal extCLK may be used, as is done in the prior art.

[Structure 1 of Data Output Control Circuit]

Figure 5:
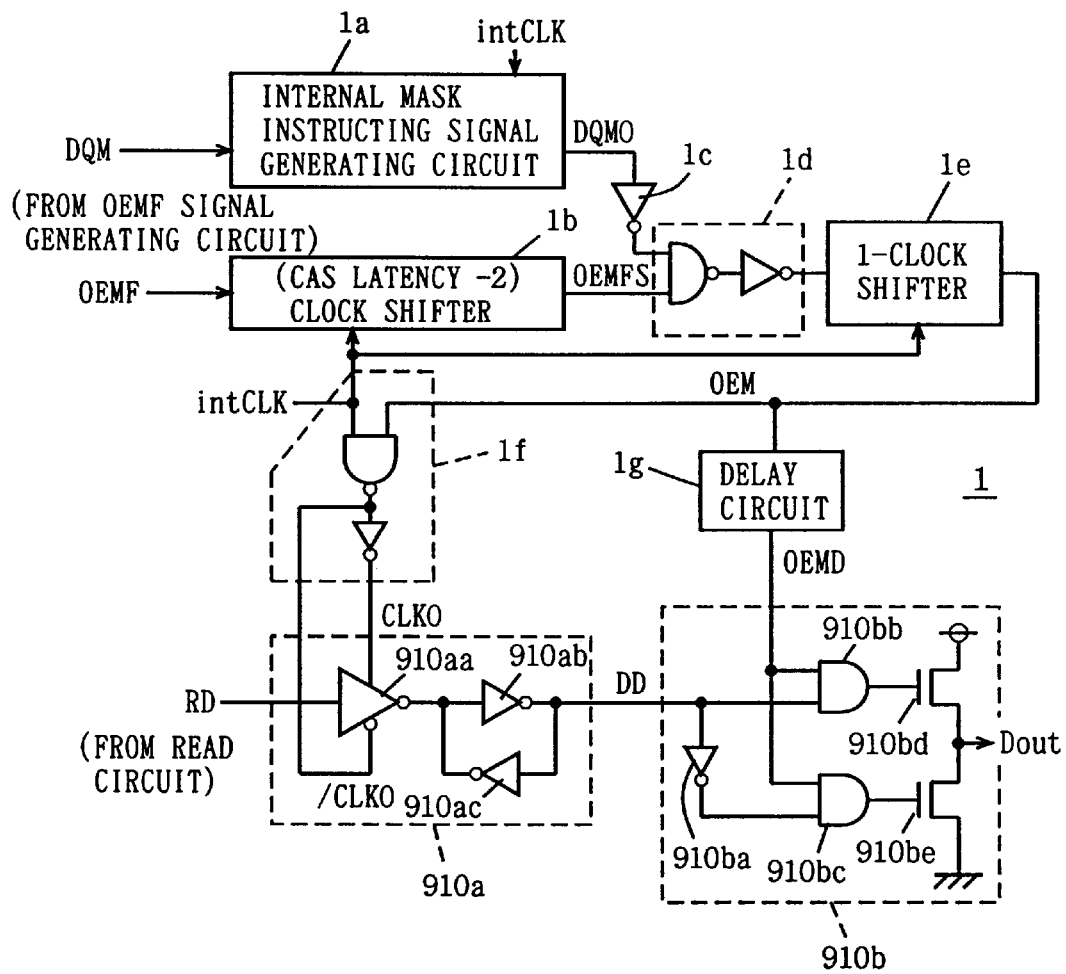
FIG. 5 schematically shows a structure of a main portion of the semiconductor memory device according to the embodiment 1 of the invention.

FIG. 5 schematically shows a structure of data output control circuit 1 and output circuit 910 shown in FIG. 1. Gate circuit 910a and output buffer circuit 910b of output circuit 910 have the same structures as those of the conventional output circuit shown in FIG. 26. Corresponding portions bear the same reference numerals, and will not be described below.

In FIG. 5, data output control circuit 1 includes an internal mask instructing signal generating circuit 1a which produces internal mask instructing signal DQM0 in accordance with externally applied data output mask instruction DQM, a (CAS latency–2) clock shifter 1b which delays read enable signal OEMF from OEMF signal generating circuit shown in FIG. 1 by (CAS latency–2) clock cycle(s), inverter circuit 1c inverting internal mask instructing signal DQM0, an AND circuit 1d which receives the output signal of (CAS latency–2) clock shifter 1b and the output signal of inverter circuit 1c, a one-clock shifter 1e which delays the output signal of AND circuit 1d by a period equal to one clock cycle of internal clock signal intCLK, a control logic gate 1f which controls on/off of gate circuit 910a in accordance with output enable signal OEM from one-clock shifter 1e and internal clock signal intCLK, and a delay circuit 1g which delays output enable signal OEM from one-clock shifter 1e by a predetermined time for application to output buffer circuit 910b.

Figure 29:
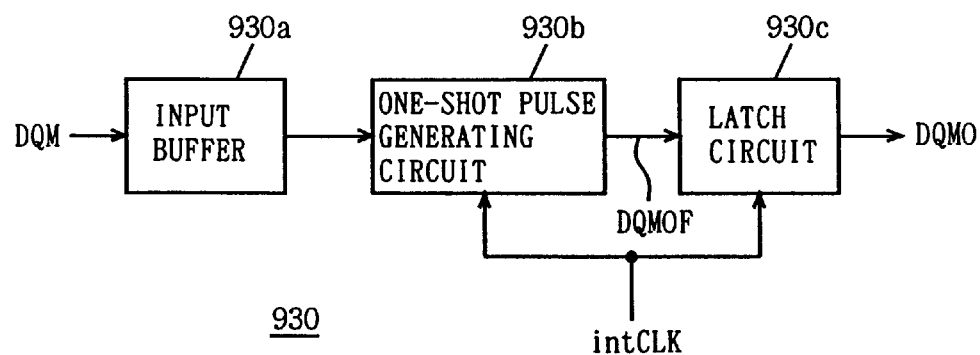
FIG. 29 schematically shows a structure of an internal mask instructing signal generating circuit shown in FIG. 28.
Figure 30:
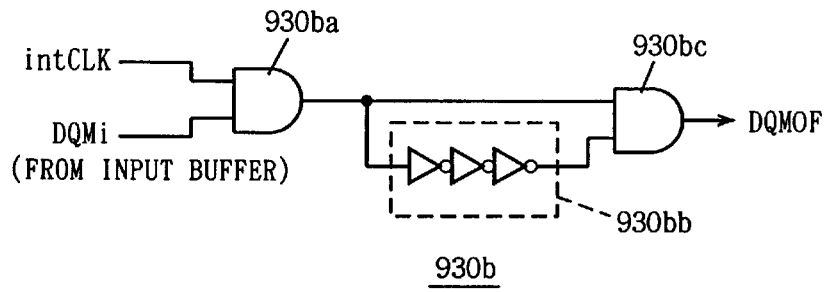
FIG. 30 shows an example of a structure of a one-shot pulse generating circuit shown in FIG. 29.
Figure 31:
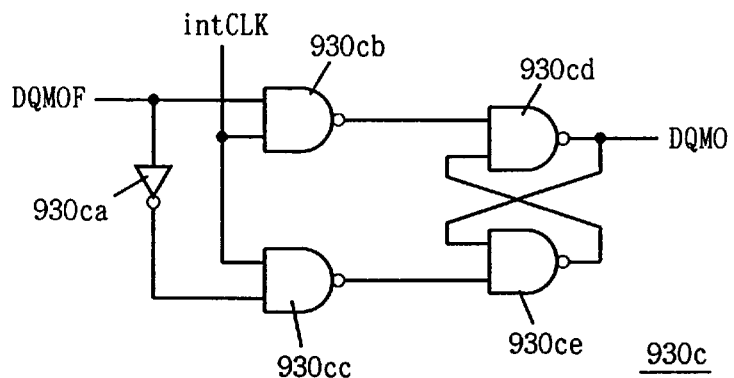
FIG. 31 schematically shows a structure of a latch circuit shown in FIG. 29.
Figure 32:
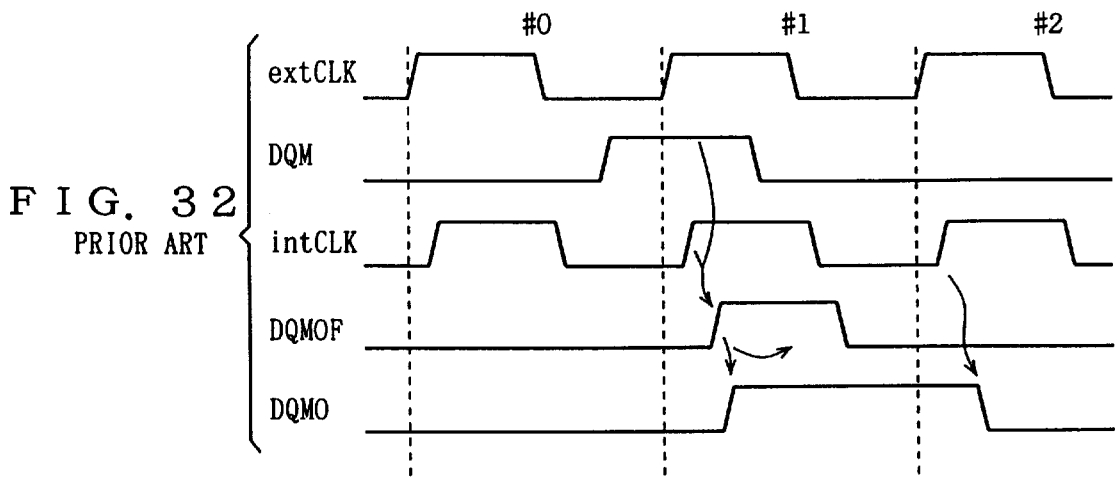
FIG. 32 is a timing chart representing an operation of the circuits shown in FIGS. 29 to 31.
Figure 33:
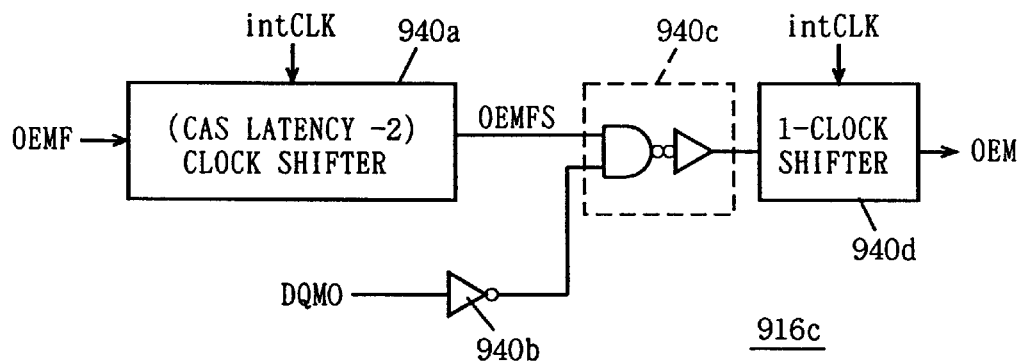
FIG. 33 schematically shows a structure of the output control circuit shown in FIG. 28.
Figure 34:
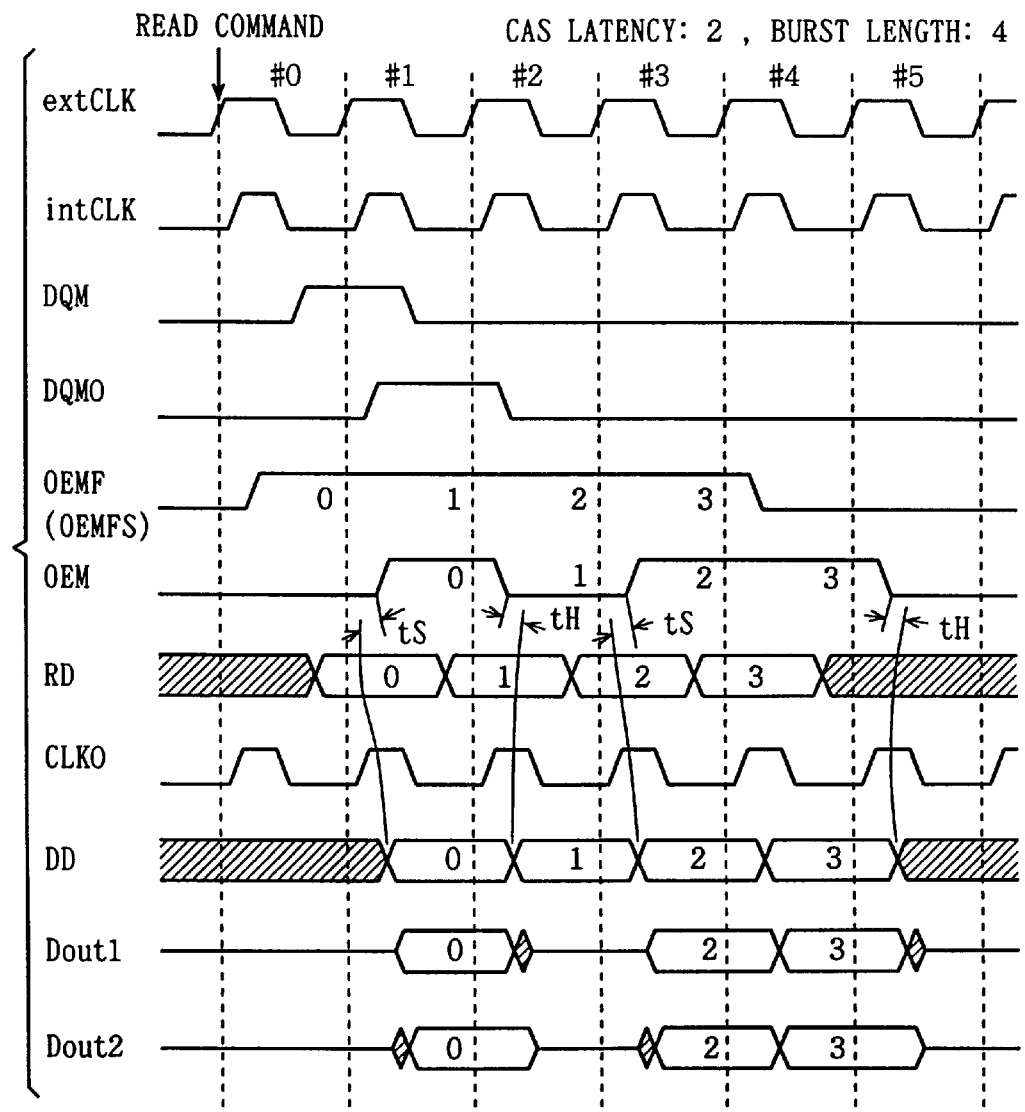
FIG. 34 is a timing chart representing a data read operation of the semiconductor memory device shown in FIG. 28.

Internal mask instructing signal generating circuit 1a has the same structure as the internal mask instructing signal generating circuit shown in FIGS. 29 to 31, and activates internal mask instructing signal DQM0 for one clock cycle period in synchronization with internal clock signal intCLK when externally applied data output mask instruction DQM is active.

AND circuit 1d includes a NAND gate receiving the output signal of inverter circuit 1c and output signal OEMFS of (CAS latency–2) clock shifter 1b, and an inverter receiving the output signal of this NAND circuit.

Control logic gate 1f includes a NAND gate receiving internal clock signal intCLK and output enable signal OEM, and an inverter receiving the output signal of this NAND gate, and produces and outputs internal clock signals CLKO and /CLKO which are complementary to each other. Control logic gate 1f enables a tristate inverter buffer 910aa included in gate circuit 910a to take in data RD from the read circuit and apply the same to output buffer circuit 910b, when internal clock signal intCLK and output enable signal OEM are at H-level enabling the data output.

Figure 6:
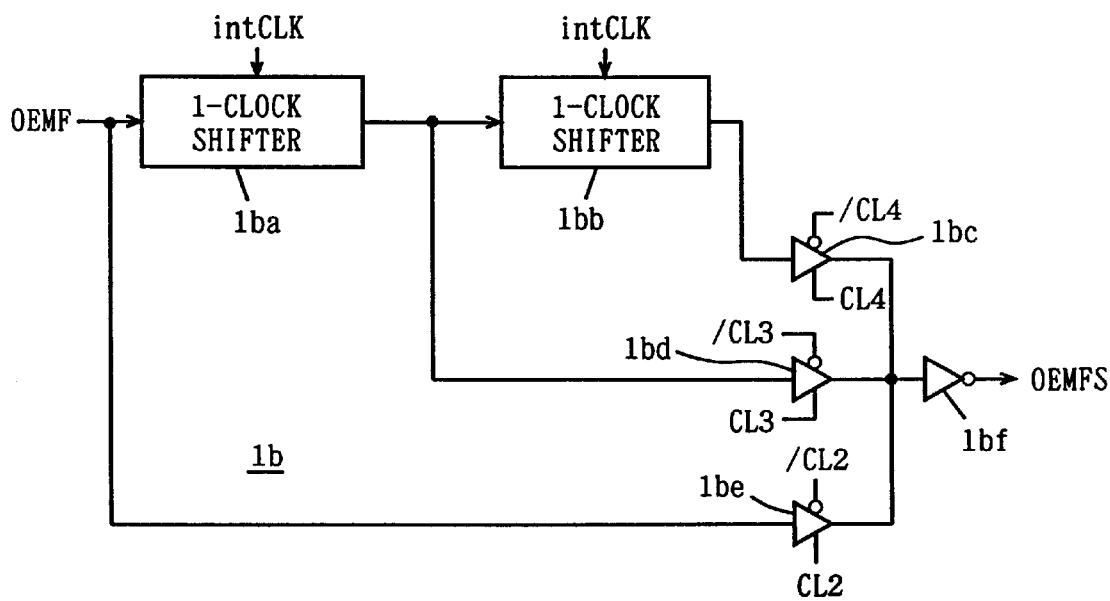
FIG. 6 schematically shows a structure of a (CAS latency-2) clock shifter shown in FIG. 5.

FIG. 6 schematically shows a structure of (CAS latency–2) clock shifter 1b shown in FIG. 5. In FIG. 6, (CAS latency–2) clock shifter 1b includes a one-clock shifter 1ba which delays read enable signal OEMF by one clock cycle period in synchronization with internal clock signal intCLK, a one-clock shifter 1bb which delays the output signal of one-clock shifter 1ba by one clock cycle period in synchronization with internal clock signal intCLK, a tristate buffer 1bc which passes the output signal of one-clock shifter 1bb therethrough when signals CL4 and /CL4 indicating that the CAS latency is 4 are active, a tristate buffer 1bd which passes the output signal of one-clock shifter 1ba therethrough when signals CL3 and /CL3 indicating that the CAS latency is 3 are active, a tristate buffer 1be which passes the read enable signal OEMF therethrough when signals CL2 and /CL2 indicating that the CAS latency is 2 are active, and an inverter 1bf which commonly receives and inverts the output signals of tristate buffers 1bc, 1bd and 1be to produce signal OEMFS.

Figure 7:
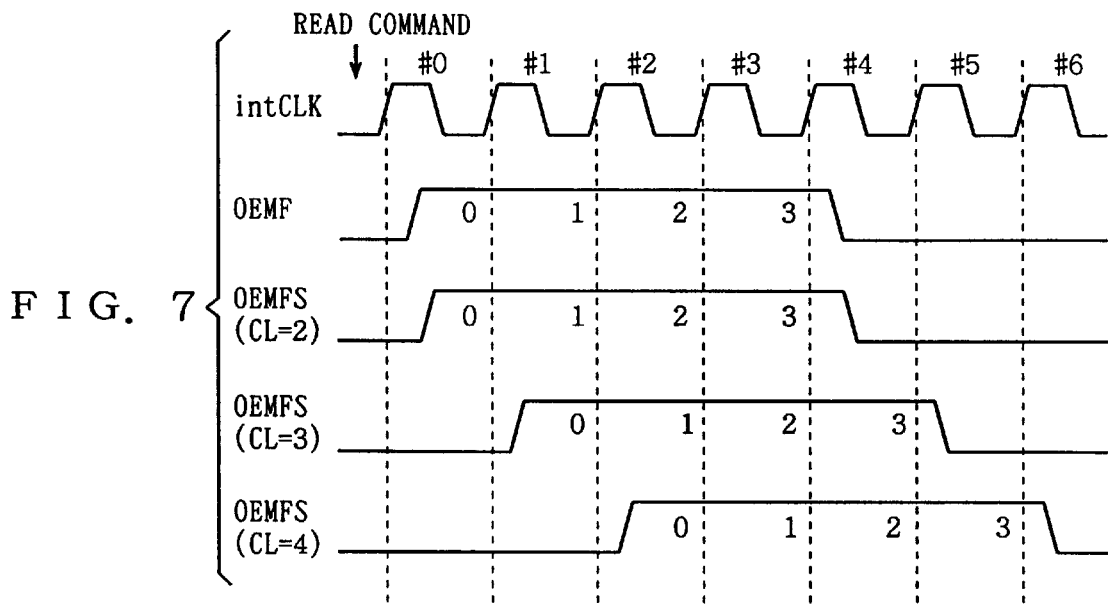
FIG. 7 is a signal waveform diagram representing an operation of the circuit shown in FIG. 6.

FIG. 7 is a timing chart representing an operation of (CAS latency–2) clock shifter 1b shown in FIG. 6. The operation of (CAS latency–2) clock shifter shown in FIG. 6 will now be described below with reference to FIGS. 6 and 7.

When the read command is applied, read enable signal OEMF attains H-level in the same clock cycle of the external clock signal as that of application of this command (i.e., clock cycle #0 of internal clock signal intCLK) and is kept high for the burst length period. According to the operation shown by way of example in FIG. 7, the burst length is 4, read enable signal OEMF is at H-level and active for a period equal to four clock cycles, and read enable signal OEMF attains the inactive state of L-level in cycle #4 of internal clock signal intCLK.

When CAS latency (CL) is 2, tristate buffer 1be (see FIG. 6) operates, and remaining tristate buffers 1bc and 1bd are kept at the output high-impedance state. When the CAS latency is 2, therefore, read enable signal OEMF is selected by tristate buffer 1*be* and inverter 1*bf*, and becomes high or active for the burst length period starting from clock cycle #0 of internal clock signal intCLK.

When CAS latency is 3 (CL=3), tristate buffer 1*bd* operates, and remaining tristate buffers 1*bc* and 1*be* are at the output high-impedance state. Therefore, the output signal of one-clock shifter 1*ba* is selected and signal OEMFS is output. Therefore, signal OEMFS attains the active state of H-level at clock cycle #1 of internal clock signal intCLK, and attains the inactive state of L-level in clock cycle #5.

When CAS latency is 4 (CL=4), tristate buffer 1*bc* operates, and tristate buffers 1*bd* and 1*be* attain the output high-impedance state. Therefore, the signal passed through one-clock shifters 1*ba* and 1*bb* is selected, and signal OEMFS is output. Thus, signal OEMFS which is delayed by two clock cycles behind read enable signal OEMF is produced when CAS latency is 4.

Signal OEMFS is high and active for a period from cycle #2 to cycle #6 of the internal clock signal. By adjusting the shift period (delay period) of the read enable signal with tristate inverter buffers 1*bc*, 1*bd* and 1*be*, the activation timing of signal OEMFS can be adjusted in accordance with the CAS latency, and a single semiconductor memory device can cope with a plurality of CAS latencies.

Figure 8A:
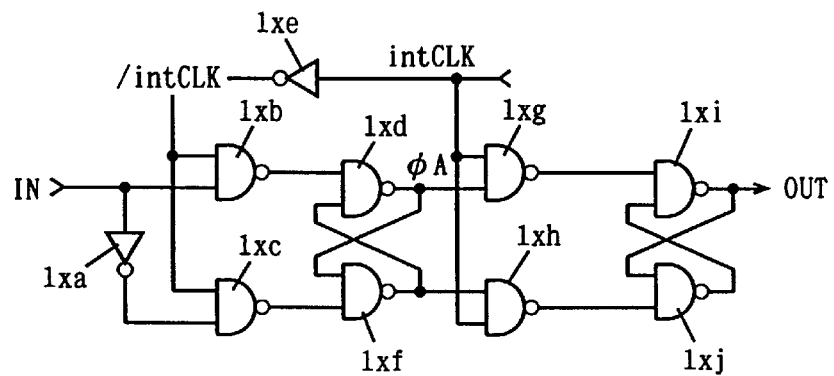
FIG. 8A shows an example of a structure of a one-clock shifter in FIGS. 5 and 6.

FIG. 8A shows structures of one-clock shifters 1*ba* and 1*bb* shown in FIG. 6 as well as one-clock shifter 1*e* shown in FIG. 5. In FIG. 8A, these one-clock shifters have a common structure and are commonly shown and, for this purpose, the input and output signals are indicated by the symbols IN and OUT, respectively. In FIG. 8A, the one-clock shifter includes an inverter 1*xa* for inverting input signal IN, a NAND circuit 1*xb* receiving internal clock signal intCLK through inverter 1*xa* and input signal IN, a NAND circuit 1*xc* receiving internal clock signal /intCLK from inverter 1*xa* and the output signal of inverter 1*xa*, a NAND circuit 1*xb* receiving on one of its two inputs the output signal of inverter 1*xb*, and a NAND circuit 1*xf* receiving the output signal of NAND circuit 1*xc* and output signal φA of NAND circuit 1*xd*. The output signal of NAND circuit 1*xf* is applied to the other input of NAND circuit 1*xd*. NAND circuits 1*xd* and 1*xf* form a flip-flop.

Figure 8B:
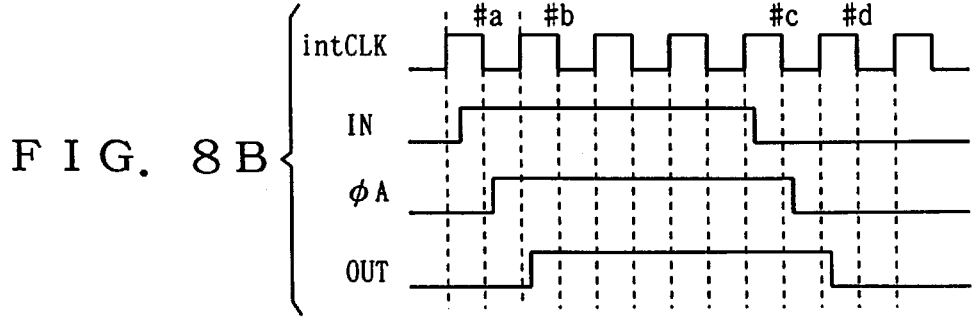
FIG. 8B is a timing chart representing an operation thereof.

The one-clock shifter further includes a NAND circuit 1*xg* receiving internal clock signal intCLK and output signal φA of NAND circuit 1*xd*, a NAND circuit 1*xh* receiving internal clock signal intCLK and the output signal of NAND circuit 1*xf*, a NAND circuit 1*xi* receiving on one of two its inputs the output signal of NAND circuit 1*xg*, and a NAND circuit 1*xj* receiving the output signals of NAND circuits 1*xh* and 1*xi*. The output signal of NAND circuit 1*xj* is applied to the other input of NAND circuit 1*xi*. NAND circuit 1*xi* generates output signal OUT. Now, the operation of the one-clock shifter shown in FIG. 8A will be described below with reference to a timing chart of FIG. 8B.

In clock cycle #a, input signal IN rises to H-level. At this time, internal clock signal /intCLK is at L-level, and the output signals of NAND circuits 1*xb* and 1*xc* are fixed at H-level so that the state of signal φA does not change. Therefore, output signal OUT does not change its state, and maintains L-level.

When internal clock signal intCLK falls to L-level in this clock cycle #a, complementary internal clock signal /intCLK rises to H-level. Thereby, NAND circuits 1*xb* and 1*xc* operate as inverters, respectively, and input signal IN is applied to NAND circuit 1*xd* through NAND circuit 1*xb* so that the state of signal φA changes. At this time, internal clock signal intCLK is at L-level, the output signals of NAND circuits 1*xg* and 1*xh* are fixed at H-level, and the state of output signal OUT does not change. Therefore, NAND circuits 1*xb*, 1*xc*, 1*xd* and 1*xf* implement the delay circuit having a delay time of half the clock cycle.

When internal clock signal intCLK rises to H-level in clock cycle #b, NAND circuits 1*xg* and 1*xh* operate as an inverter and pass signal φA therethrough so that output signal OUT changes. This operation is repeated, and output signal OUT maintains H-level while input signal IN is at H-level.

When input signal IN lowers to L-level in clock cycle #C, this input signal IN is transmitted in response to the falling of internal clock signal intCLK in clock cycle #c, and the state of internal signal φA changes. Internal clock signal intCLK is at L-level, and the state of output signal OUT does not change. When internal clock signal intCLK rises to H-level in clock cycle #d, signal φA is transmitted through NAND circuit 1*xg*, and the output signal OUT changes. Therefore, signal OUT produced by delaying input signal IN by a period equal to one clock cycle of internal clock signal intCLK can be obtained by the shift operation.

Then, the operations of the data output control circuit and the output circuit shown in FIG. 5 will be described below with reference to a timing chart of FIG. 9. FIG. 9 represents a data read operation performed with the CAS latency of 2 and the burst length of 4. Internal clock signal intCLK is produced in the form of one-shot pulse in accordance with external clock signal extCLK (by using the clock input buffer shown in FIG. 3A or 4A).

The read command is applied in cycle #0 of external clock signal extCLK. In accordance with this read command, read enable signal OEMF is driven to the active state in synchronization with the rising of internal clock signal intCLK in clock cycle #0. Since the CAS latency is 2, signal OEMFS from (CAS latency−2) clock shifter 1*b* is driven to the active state simultaneously with read enable signal OEMF. In accordance with read enable signal OEMF, column selection is performed in the memory cell array under the control by select/read control circuit 921 shown in FIG. 1, and a selected memory cell data is applied to read circuit 908. This read data RD is made definite at a latter half of clock cycle #0.

At the rising edge of external clock signal extCLK in clock cycle #1, externally applied data output mask instruction DQM is activated to attain H-level so that internal mask instructing signal DQM0 becomes active for one clock cycle period starting from clock cycle #1. Internal data mask instructing signal DQM0 changes in synchronization with internal clock signal intCLK (see FIGS. 29–31).

In clock cycle #1, read data RD is already defined. Control logic gate 1*f* (see FIG. 5) holds clock signal CLKO for reading at the inactive state of L-level, because output enable signal OEM is at L-level or inactive. When output enable signal OEM rises to H-level in clock cycle #1, clock signal CLKO for reading is driven to H-level in accordance with internal clock signal intCLK and output enable signal OEM so that gate circuit 910*a* is turned on, and read data RD is transmitted to output buffer circuit 910*b*. Output enable signal OEM is driven to the active state of H-level in synchronization with internal clock signal intCLK. Therefore, read data RD which is definite can be reliably transmitted to output buffer circuit 910*b*.

Output enable signal OEM is applied to output buffer circuit 910*b* through delay circuit 1*g*. Therefore, output buffer circuit 910*b* is enabled in accordance with delayed output enable signal OEMD, to buffer internal data DD for producing external read data Dout. Therefore, as can be seen from output data Dout1 shown in FIG. 9, if the delay time of delayed output enable signal OEMD to output enable signal OEM is sufficiently long, the setup time of internal data DD with respect to delay output enable signal OEMD can be sufficiently long so that it is possible to prevent output of invalid data.

In accordance with external mask instruction DQM in clock cycle #1, output enable signal OEM is driven to the inactive state of L-level in clock cycle #2. Thereby, internal clock signal CLKO for data output in clock cycle #2 maintains the inactive state (L-level), and gate circuit 910a maintains the off state. In this clock cycle #2, gate circuit 910a continues output of read data RD(0) which was taken in clock cycle #1, and hold time tH of internal data DD with respect to delayed output enable signal OEMD is extended to the time of change of internal data DD in next clock cycle #3. Accordingly, the hold time can be sufficiently long, and output of invalid data at the time of change of output enable signal OEM is prevented.

In clock cycle #3, output enable signal OEM is activated again. In response to the activation of output enable signal OEM, clock signal CLKO for output rises to H-level again, and gate circuit 910a is turned on to transmit data RD, which is applied from the read circuit, to output buffer circuit 910b as internal data DD. In this case, output enable signal OEM is synchronized with clock signal CLKO for output, as is done in clock cycle #1, and the setup time of internal data DD with respect to the rising of delayed output enable signal OEMD is sufficiently increased by delay circuit 1g so that output of invalid data can be prevented.

Data which is the last in the burst length is output in subsequent clock cycle #4, and output enable signal OEM falls to L-level in clock cycle #5. In response to the falling of output enable signal OEM to L-level, internal clock signal CLKO maintains L-level, and gate circuit 910a continues output of the data which was taken in and latched in clock cycle #4. Therefore, a sufficiently long hold time can be set for data DD(3) which is the last in the burst length with respect to delayed output enable signal OEMD, and output of invalid data can likewise be prevented in this case.

In the structure of data output control circuit shown in FIG. 5, clock signal CLKO for output is generated only when output enable signal OEM is at H-level, and the generation of clock signal CLKO for output is stopped when the data output is masked and when the burst data is ended. Therefore, transmission of instable internal read data RD to output buffer circuit as internal data DD can be reliably prevented, and hold time tH with respect to output enable signal OEM can be made sufficiently long.

If the delay time of gate circuit 910a is relatively short, the setup time of internal data DD with respect to output enable signal OEM is short, and invalid data may be output (see output data Dout2 in FIG. 9). However, by using delay circuit 1g for generating delayed output enable signal OEMD to the output buffer circuit, setup time tS can be sufficiently increased, and generation of invalid data can be reliably suppressed.

According to the embodiment 1 of this embodiment, as described above, the gate circuit is turned on in synchronization with the internal clock signal only when the output enable signal is active, and the internal data is latched into the gate circuit and is transmitted to the output buffer circuit Therefore, the hold time of the internal data with respect to the output enable signal can be made sufficiently long, and it is possible to reliably prevent the output of invalid data at the time when the output buffer circuit attains the output high-impedance state. By using the delayed signal of this output enable signal, enable/disable of the output buffer circuit is controlled. Thereby, the setup time of the internal data with respect to enabling of the output buffer circuit can be made sufficiently long. Therefore, it is possible to produce the internal data having the long setup time and the long hold time so that output of invalid data can be reliably prevented.

Thereby, generation of power supply noises due to invalid data can be suppressed, and it is possible to prevent a malfunction at the circuitry such as a processor or a logic unit, which may be caused by a variation in system power supply. Therefore, it is possible to improve an operation margin of the whole system, because the operation margin must be determined in view of the margin with respect to noises.

Embodiment 2

Figure 10:
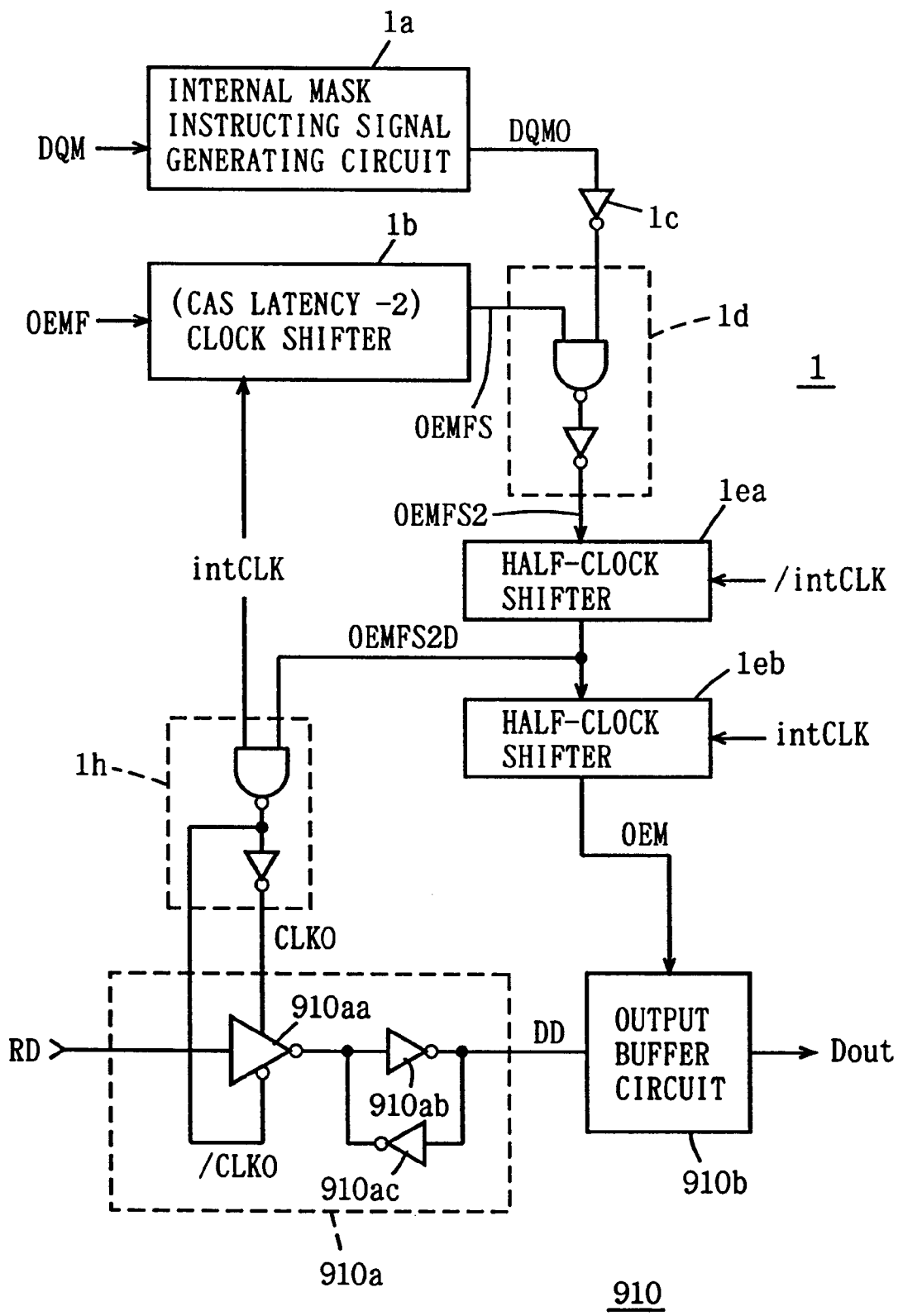
FIG. 10 schematically shows a structure of a main portion of a semiconductor memory device according to an embodiment 2 of the invention.

FIG. 10 shows a main portion of a semiconductor memory device according to an embodiment 2 of the invention. FIG. 10 shows structures of data output control circuit 1 and output circuit 910. Similarly to the foregoing embodiment 1 (see FIG. 5), data output control circuit 1 includes internal mask instructing signal generating circuit 1a, (CAS latency−2) clock shifter 1b, inverter 1c for inverting internal mask instructing signal DQM0 from internal mask instructing signal generating circuit 1a, AND circuit 1d receiving the output signals of inverter 1c and (CAS latency−2) clock shifter 1b, a half-clock shifter 1ea which shifts the output signal of AND circuit 1d in accordance with complementary clock signal /intCLK, a half-clock shifter 1ea which shifts an output signal OEMFS2 of half-clock shifter 1ea in accordance with internal clock signal intCLK, and a control logic gate 1h which generates internal clock signals CLKO and /CLKO for output to gate circuit 910a in accordance with output signal OEMF2D of half-clock shifter 1ea and internal clock signal intCLK.

Each of half-clock shifters 1ea and 1eb corresponds to the single shift stage shown in FIG. 8A. Therefore, half-clock shifters 1ea and 1eb are equivalent to the half-clock shifters, which are prepared by dividing one-clock shifter 1e in the embodiment 1 into two substages, except for that they produce internal clock signal CLKO for output by using a signal OEMFS2 preceding output enable signal OEM by half the clock cycle. Structures other than the above are the same as those in the embodiment 1 (see FIG. 5). Output circuit 910 is similar to that in the embodiment 1. Corresponding portions bear the same reference numerals, and will not be described below.

Figure 11:
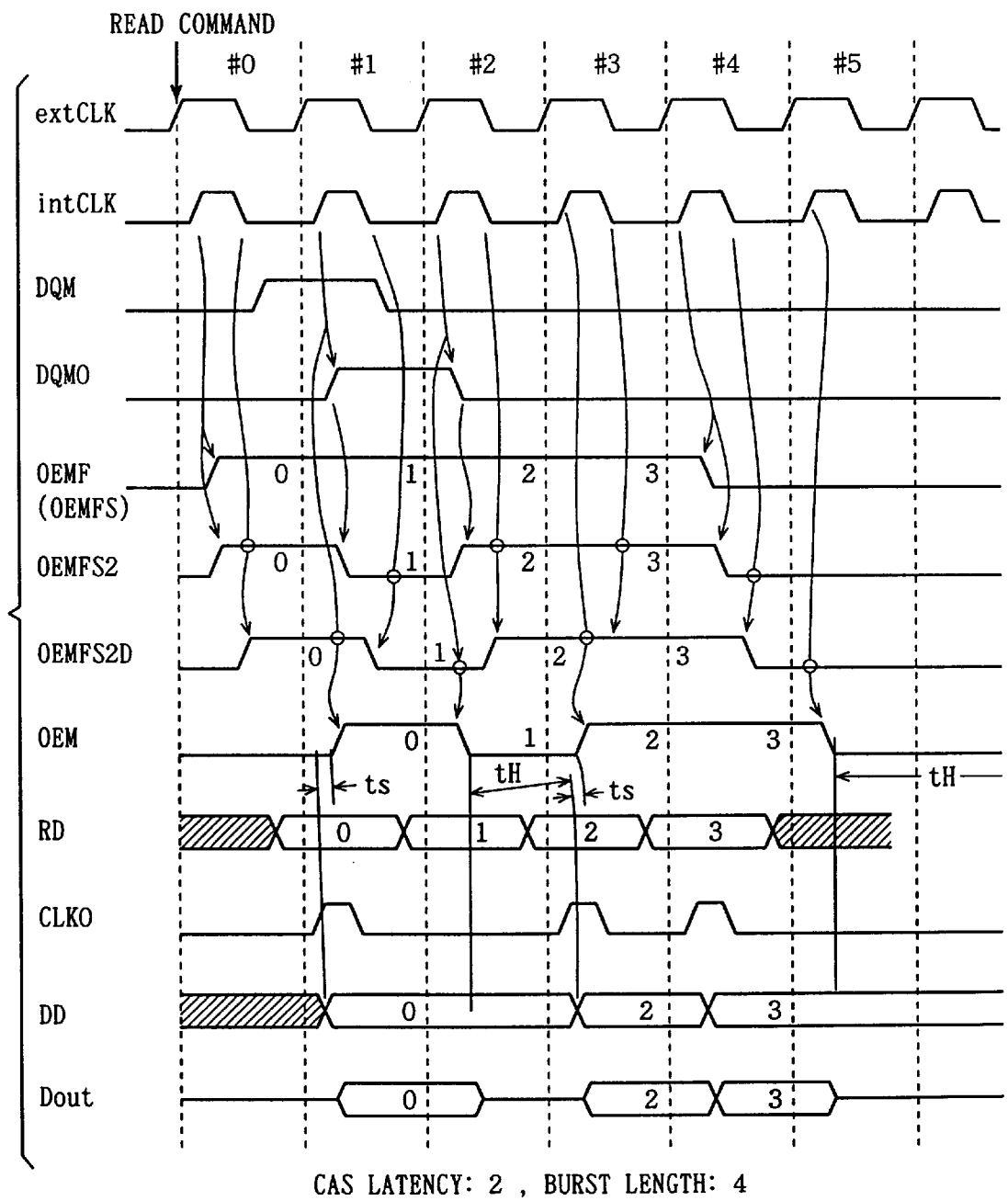
FIG. 11 is a timing chart representing an operation of the circuit shown in FIG. 10.

Operations of the output control circuit and output circuit shown in FIG. 10 will be described below with reference to a timing chart of FIG. 11. FIG. 11 shows the data read operation performed with the CAS latency of 2 and the burst length of 4.

A read command is applied in clock cycle #0 of external clock signal extCLK. In accordance with this read command, read enable signal OEMF attains the active state of H-level. Since the CAS latency is 2, signal OEMFS from (CAS latency 2) clock shifter 1b rises to H-level in clock cycle #0. In this clock cycle #0, external mask instructing signal DQM is at L-level so that signal OEMFS2 from gate circuit 1d rises to H-level in response to the rising of signal OEMFS.

Then, half-clock shifter 1ea takes in output signal OEMFS2 of gate circuit 1d in synchronization with falling of internal clock signal intCLK, and drives signal OEMFS2D to H-level. In clock cycle #0, selection of the memory cell column and reading of data from the selected memory cell are internally performed, and read data RD is made definite in the latter half of clock cycle #0. Although signal OEMFS2D attains H-level, internal clock signal intCLK is at L-level. Therefore, clock signal CLKO for output holds the L-level in clock cycle #0.

When internal clock signal intCLK rises to H-level in clock cycle #1, clock signal CLKO for output from control logic gate 1*h* attains H-level, because signal OEMFS2D is at H-level. Thereby, read data RD is transmitted to output buffer circuit 910*b* through gate circuit 910*a*. In synchronization with the rising of internal clock signal intCLK, half-clock shifter 1*eb* takes in output signal OEMFS2D of half-clock shifter 1*ea*, and raises output enable signal OEM to H-level. When output enable signal OEM rises to H-level, output buffer circuit 910*b* is enabled to buffer internal data DD and produce external data Dout.

Also, in clock cycle #1, externally applied data output mask instruction DQM attains H-level, and internal mask instructing signal DQM0 rises to H-level in synchronization with the rising of internal clock signal intCLK. When internal mask instructing signal DQM0 rises to H-level, half-clock shifter 1*ea* lowers output signal OEMFS2 of gate circuit 1*d* to L-level.

While internal clock signal intCLK is at H-level, half-clock shifter 1*ea* is in the latch state, and its output signal OEMFS2D is at H-level. When internal clock signal intCLK falls to L-level, half-clock shifter 1*ea* takes in output signal OEMFS2 of gate circuit 1*d*, lowers its own output signal OEMFS2D to L-level, and holds internal clock signal CLKO at L-level. In response to the falling of internal clock signal intCLK, half-clock shifter 1*eb* enters the latching state. Therefore, output signal OEM from half-clock shifter 1*eb* maintains H-level during clock cycle #1.

In clock cycle #2, half-clock shifter 1*ea* maintains its output signal OEMFS2D at L-level, because it is in the latch state while internal clock signal intCLK is at H-level. Also, internal clock signal CLKO for output is held at L-level by control logic gate 1*h*. Therefore, gate circuit 910*a* is prohibited from taking in data RD(1) which is read through clock cycles #1 and #2, and data DD(0) which was read in clock cycle #1 is continuously applied to output buffer circuit 910*b*.

When internal clock signal intCLK rises to H-level, half-clock shifter 1*eb* takes in output signal OEMFS2D of half-clock shifter 1*ea*, and lowers output enable signal OEM to L-level. Therefore, output buffer circuit 910*b* attains the output high-impedance state. Upon this deactivation of output enable signal OEM, internal data DD is continuously applied from gate circuit 910*a* during this clock cycle #2. Therefore, a sufficiently long hold time tH can be ensured, and output of invalid data does not occur.

Externally applied data output mask instruction DQM is activated only in clock cycle #1, and is driven to L-level in clock cycle #2 so that internal mask instructing signal DQM0 falls to L-level in synchronization with the rising of internal clock signal intCLK in clock cycle #2. In response to the falling of internal mask instructing signal DQM0, signal OEMFS2 from gate circuit 1*d* rises to H-level and continuously holds H-level for the burst length period. When signal OEMFS2 rises to H-level in clock cycle #2, half-clock shifter 1*ea* takes in signal OEMF2 in synchronization with the falling of internal clock signal intCLK, and drives its output signal OEMFS2D to H-level. In clock cycle #2, even when signal OEMFS2D rises to H-level, half-clock shifter 1*eb* is in the latch state attained in response to the falling of internal clock signal intCLK, and output enable signal OEM maintains the inactive state of L-level.

In clock cycle #3, when internal clock signal intCLK rises to H-level, internal clock signal intCLKO for output rises to H-level, because signal OEMFS2D is at H-level. Thereby, gate circuit 910*a* is turned on to transmit internal read data RD(2) to output buffer circuit 910*b*.

Half-clock shifter 1*eb* takes in output signal OEMFS2D of half-clock shifter 1*ea* in synchronization with the rising of internal clock signal intCLK, and drives output enable signal OEM to H-level.

Control logic gate 1*h* operates as a buffer when signal OEMFS2D is at H-level, and produces internal clock signal CLKO for output in accordance with internal clock signal intCLK. Meanwhile, half-clock shifter 1*eb* takes in signal OEMF2D in synchronization with the rising of internal clock signal intCLK, and produces output enable signal OEM. Therefore, output enable signal OEM attains the active state of H-level at a timing later than the rising of internal clock signal CLKO for data output. Accordingly, gate circuit 910*a* is turned on at a timing earlier than the activation of output enable signal OEM, and takes in and transmits internal read data RD to output buffer circuit 910*b*.

Thereafter, output enable signal OEM is activated so that setup time tS of internal data DD with respect to output enable signal OEM can be sufficiently increased. Invalid data is not output even at the time of transition from the data output masked state to the data output state, and output data Dout can be stably produced in accordance with internal read data RD. Particularly, if the delay time of half-clock shifter 1*eb* is much longer than the delay time of gate circuit 910*a*, setup time tS can be made sufficiently long.

In clock cycle #4, read enable signal OEMF and signal OEMFS from (CAS latency−2) clock shifter 1*b* fall to L-level in synchronization with the rising of internal clock signal intCLK because all the burst length data have been read. Thereby, output signal OEMFS2 from gate circuit 1*d* falls to L-level, and half-clock shifter 1*ea* takes in signal OEMFS2 in synchronization with the falling of internal clock signal intCLK, and lowers its output signal OEMFS2D to L-level. Half-clock shifter 1*eb* attains the latching state in synchronization with the falling of internal clock signal intCLK, and output enable signal OEM maintains H-level. In clock cycle #4, therefore, internal read data RD(3) is transmitted to output buffer circuit 910*b* through gate circuit 910*a* in accordance with internal clock signal CLKO for output, and output buffer 910*b* produces output data Dout.

In clock cycle #5, half-clock shifter 1*eb* takes in signal OEMFS2D at L-level, and drives output enable signal OEM to L-level in synchronization with the rising of internal clock signal intCLK. Thereby, output circuit 910 attains the output high-impedance state. In this state, gate circuit 910*a* is in the latching state (internal clock signal CLKO maintains L-level because signal OEMFS2D is at L-level), and the hold time of data DD with respect to the falling of output enable signal OEM is sufficiently long. Therefore, invalid data is not output at the time of transition to this output high-impedance state.

As shown in FIG. 10, signal OEMFS2D which precedes output enable signal OEM by half the clock cycle is used for producing internal clock signal CLKO for output, whereby the setup time and hold time with respect to the change in output enable signal can be made sufficiently long, and output of invalid data can be prevented.

In particular, if control logic gate 1*h* producing internal clock signal CLKO for output as well as gate circuit 910*a* taking in internal read data RD and transmitting internal data DD to output buffer circuit 910b have delay times which can be ignored as compared with the delay time of half-clock shifter 1eb, setup time tS of internal data DD with respect to output enable signal OEM can be set to a desired value, and it is not necessary to delay output enable signal OEM. Therefore, fast data reading is implemented.

Embodiment 3

Figure 12:
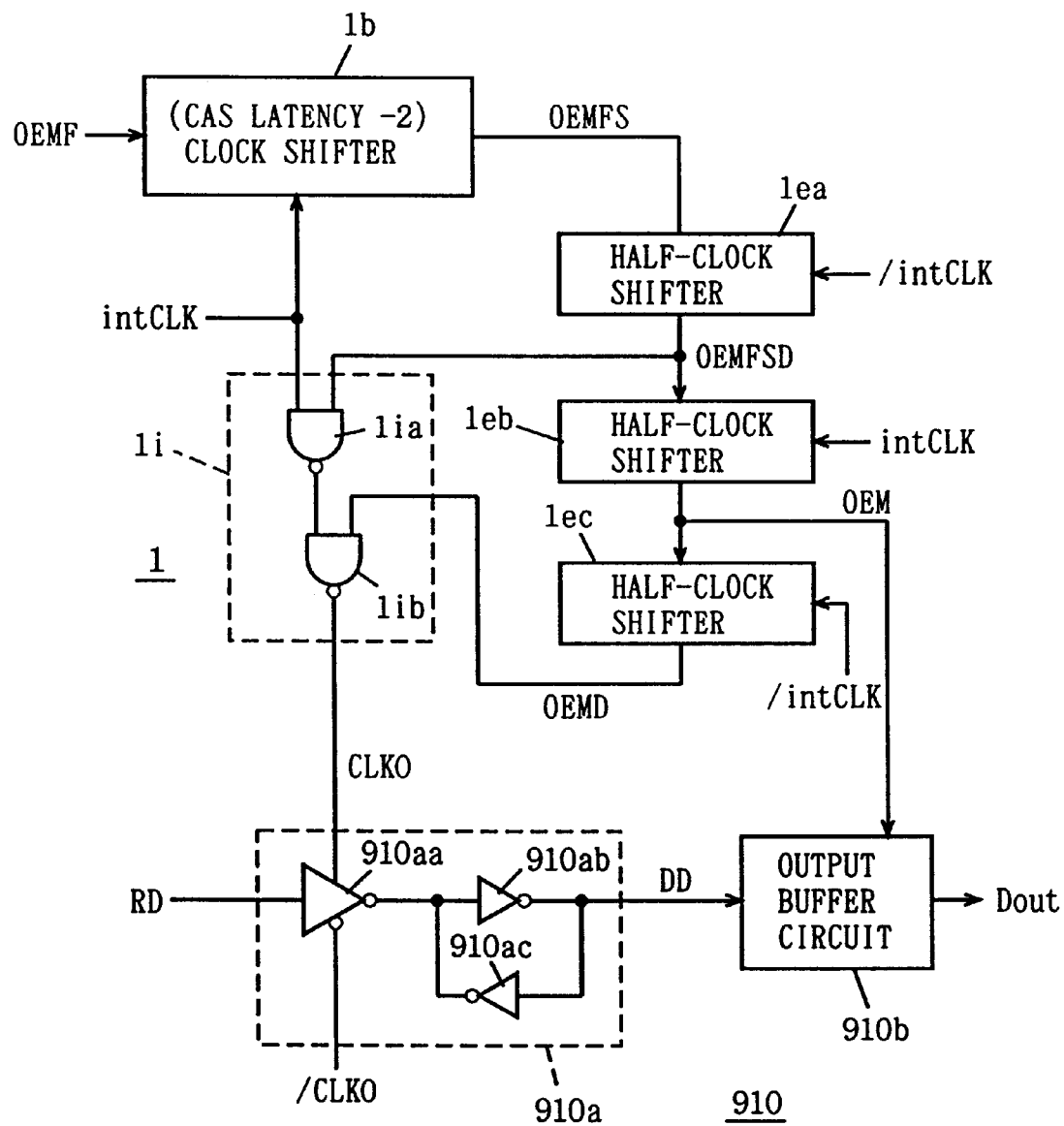
FIG. 12 schematically shows a structure of a main portion of a semiconductor memory device according to an embodiment 3 of the invention.

FIG. 12 shows a structure of a main portion of a semiconductor memory device according to an embodiment 3 of the invention. FIG. 12 likewise shows structures of data output control circuit 1 and output circuit 910. In FIG. 12, data output control circuit 1 includes (CAS latency−2) clock shifter 1b which shifts read enable signal OEMF from an OEMF signal generating circuit (not shown) in accordance with internal clock signal intCLK, half-clock shifter 1ea which shifts output signal OEMFS of (CAS latency−2) clock shifter 1b by half the clock cycle of internal clock signal intCLK, half-clock shifter 1eb which shifts output signal OEMFSD of half-clock shifter 1ea by half the clock cycle of internal clock signal intCLK, half-clock shifter 1ec which shifts output signal OEM of half-clock shifter 1eb by half the clock cycle of internal clock signal intCLK, a control logic gate 1i which produces internal clock signal CLKO for data output in accordance with internal clock signal intCLK and output signals OEMFSD and OEMD of half-clock shifters 1ea and 1ec.

The output enable signal OEM from half-clock shifter 1eb is applied to output buffer circuit 910b. Half-clock shifters 1ea and 1ec take in the signals applied in synchronization with complementary internal clock signal /intCLK, and half-clock shifter 1eb takes in the signal applied in synchronization with internal clock signal intCLK.

Control logic gate 1i includes an NAND circuit 1ia which receives internal clock signal intCLK and signal OEMFSD from half-clock shifter 1ea, and an NAND circuit 1ib which receives the output signal of NAND circuit 1ia and signal OEMD sent from half-clock shifter 1ec, and produces internal clock signal CLKO for data output. Gate circuit 910a and output buffer circuit 910b have the same structures as those in the foregoing embodiment. Corresponding portions bear the same reference numerals, and will not be described below.

Figure 13:
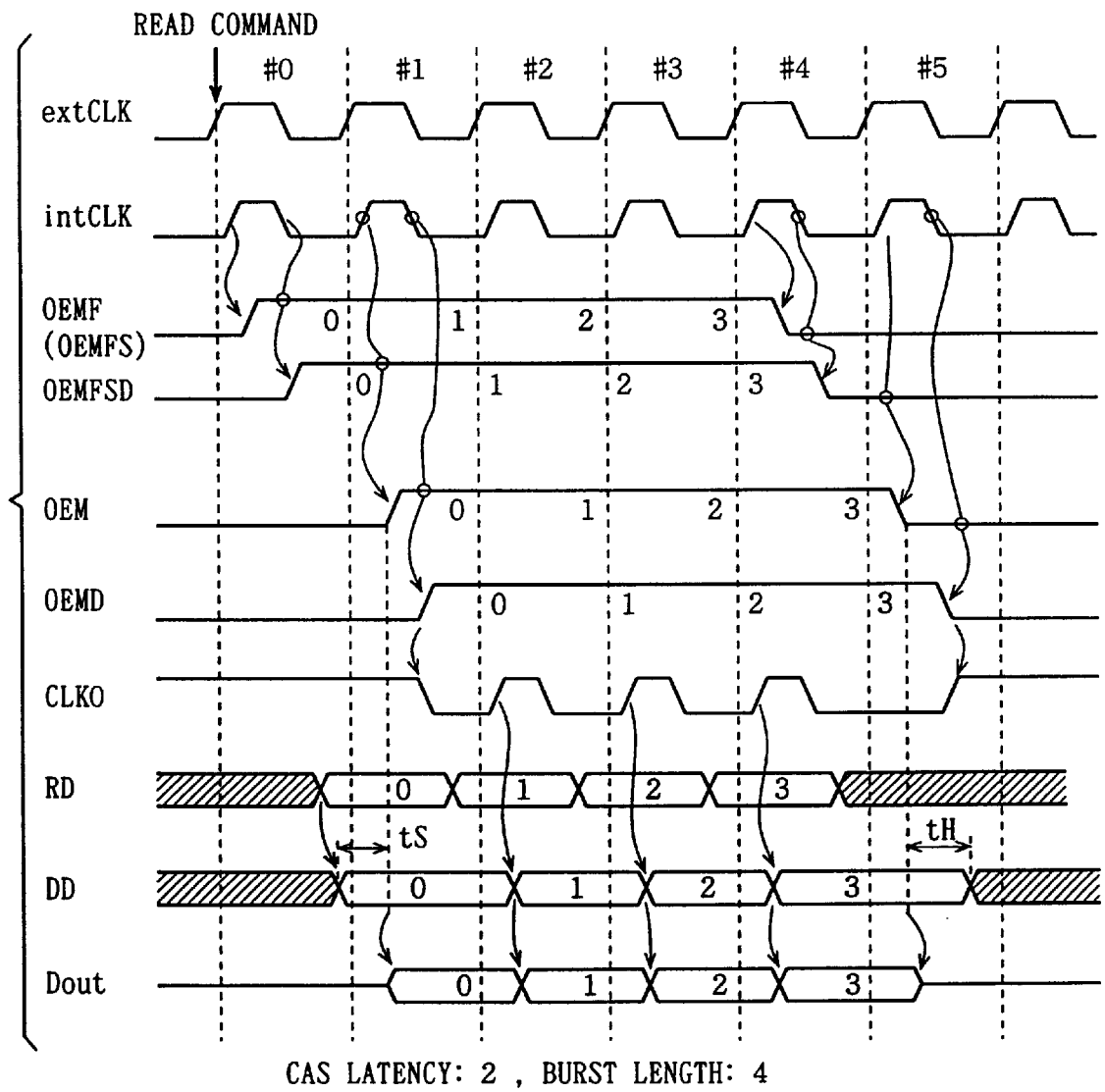
FIG. 13 is a timing chart representing an operation of the circuit shown in FIG. 12.

In the structure shown in FIG. 12, when signal OEMD from half-clock shifter 1ec is at L-level inactive, internal clock signal CLKO for data output is at H-level, and gate circuit 910a transmits internal read data RD to output buffer circuit 910. Therefore, internal read data RD is transmitted to output buffer circuit 910b before output enable signal OEM is activated, so that the set up time of internal data DD with respect to output enable signal OEM can be made long. When signal OEMFSD attains the inactive state of L-level and signal OEMD is at H-level or active, internal clock signal CLKO for data output attains L-level, and gate circuit 910a is turned off and attains the state of latching the applied date. Therefore, gate circuit 910a attains the latching state before deactivation of output enable signal OEM, and the hold time of internal data DD with respect to output enable signal OEM can be increased. Thereby, output of invalid data can be prevented. Operation of the data output control circuit and the output circuit shown in FIG. 12 will be described below with reference to a timing chart of FIG. 13.

When the read command is applied in clock cycle #0, read enable signal OEMF rises to H-level in synchronization with the rising of internal clock signal intCLK. Since the CAS latency is 2, signal OEMFS from (CAS latency−2) clock shifter 1b also rises to H-level. Since half-clock shifter 1ea takes in the signal applied in synchronization with complementary internal clock signal /intCLK, signal OEMFSD rises to H-level in accordance with internal clock signal intCLK in clock cycle #0.

In clock cycle #0, output enable signal OEM and signal OEMD are both inactive at L-level, and output buffer circuit 910b is in the output high-impedance state. Meanwhile, internal clock signal CLKO generated from control logic gate 1i is at H-level, and tristate inverter buffer 910aa of gate circuit 910a is in the operating state. Therefore, data RD read in clock cycle #0 is transmitted to output buffer circuit 910b through gate circuit 910a.

In clock cycle #1, half-clock shifter 1eb takes in applied signal OEMFSD in synchronization with internal clock signal intCLK, and drives output enable signal OEM to H-level. Thereby, output buffer circuit 910b attains the output low-impedance state, and buffers internal data DD to produce output data Dout. When output buffer circuit 910b attains the operating state, i.e., when output enable signal OEM is activated to attain H-level, internal data DD is already transmitted so that setup time tS of internal data DD with respect to output enable signal OEM has a sufficient length. Therefore, output data Dout is produced in accordance with internal data DD without producing invalid data.

In clock cycle #1, half-clock shifter 1ec takes in output enable signal OEM in synchronization with the falling of internal clock signal intCLK, and drives its output signal OEMD to H-level, and NAND circuit 1ib included in control logic gate 1i operates as an inverter. At this time, signal OEMFSD is also at H-level, and NAND circuit 1ia operates as an inverter so that internal clock signal CLKO for output is produced in accordance with internal clock signal intCLK. For the burst length period, i.e., during clock cycles #2, #3 and #4, internal data DD is produced in accordance with internal read data RD, and output data Dout is produced.

In clock cycle #4, the burst length period expires. Therefore, read enable signal OEMF is deactivated, and signal OEMFS from (CAS latency−2) clock shifter 1b falls to L-level. While internal clock signal intCLK is at H-level, half-clock shifter 1ea is in the latching state so that signal OEMFSD holds H-level, and signal OEMFSD falls to L-level in synchronization with the falling of internal clock signal intCLK, to raise the output signal of NAND circuit 1ia to H-level. Since signal OEMD is still at H-level, clock signal CLKO from NAND circuit 1ib is held at L-level.

In clock cycle #5, half-clock shifter 1eb takes in signal OEMFSD in synchronization with the rising of internal clock signal intCLK, and drives output enable signal OEM to the inactive state of L-level. Thereby, output buffer circuit 910b attains the output high-impedance state. In clock cycle #5, even when internal clock signal intCLK rises to H-level, clock signal CLKO from control logic gate 1i maintains L-level because signal OEMD is at H-level. Therefore, gate circuit 910a maintains the latching state.

Internal clock signal CLKO for output is held at L-level until half-clock shifter 1ec takes in output enable signal OEM and drives signal OEMD to L-level in synchronization with the falling of internal clock signal intCLK in clock cycle #5. Therefore, internal data DD at the time of deactivation of output enable signal OEM has hold time tH equal to half the clock cycle of internal clock signal intCLK with respect to output enable signal OEM, and output of invalid data can be reliably prevented at the time of deactivation of output enable signal OEM. Thereafter, output buffer circuit 910b holds the output high-impedance state as a result of deactivation of output enable signal OEM, although internal clock signal CLKO is held at H-level and gate circuit 910a is held ON.

According to the embodiment 3 of the invention, as described above, internal clock signal CLK for output is set to state holding the gate circuit in the on state, and the delayed signal of the output enable signal controlling the output impedance of the output buffer circuit is utilized to produce the clock signal for output in accordance with the internal clock signal. Also, the signal preceding the output enable signal by half the clock cycle is used to stop generation of the internal clock signal and, thereafter, the delayed output enable signal is used to hold the gate circuit on. At the time of activation of the output enable signal, therefore, the data is already applied to the output buffer circuit. Also, at the time of deactivation of output enable signal OEM, generation of the internal clock signal is stopped, and the gate circuit is in the latch state. Therefore, the setup time and the hold time of the internal data can be sufficiently long, and output of invalid data can be prevented.

Embodiment 4

Figure 14:
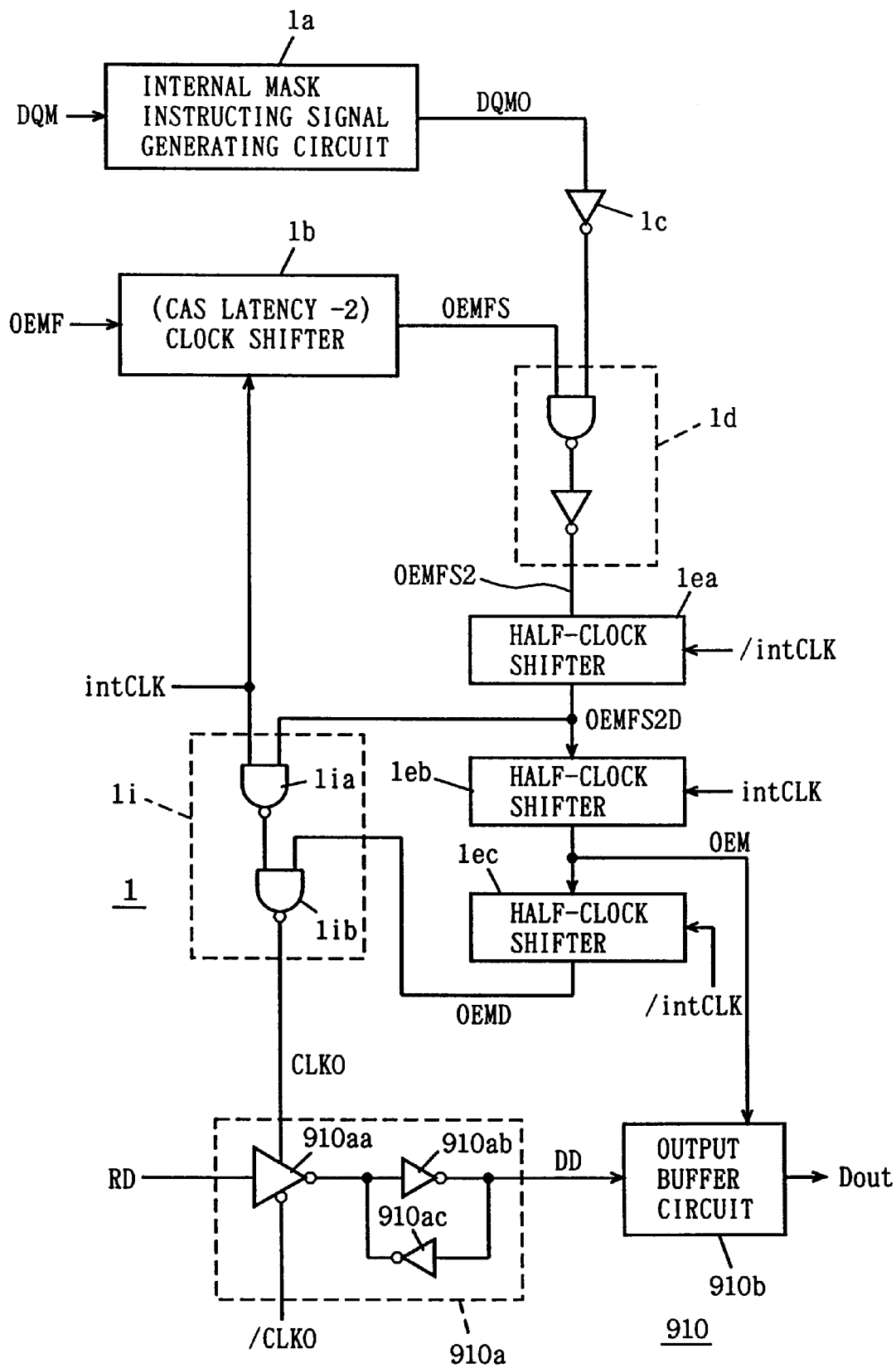
FIG. 14 schematically shows a structure of a main portion of a semiconductor memory device according to an embodiment 4 of the invention.

FIG. 14 shows a structure of a main portion of a semiconductor memory device according to an embodiment 4 of the invention. FIG. 14 likewise shows structures of data output control circuit 1 and output circuit 910. The structures shown in FIG. 14 are the same as those shown in FIG. 12 except for that internal mask instructing signal DQM0 from internal mask instructing signal generating circuit 1a and output signal OEMFS from (CAS latency−2) clock shifter 1b are used to produce internal clock signal CLKO for output and output enable signal OEM.

Figure 15:
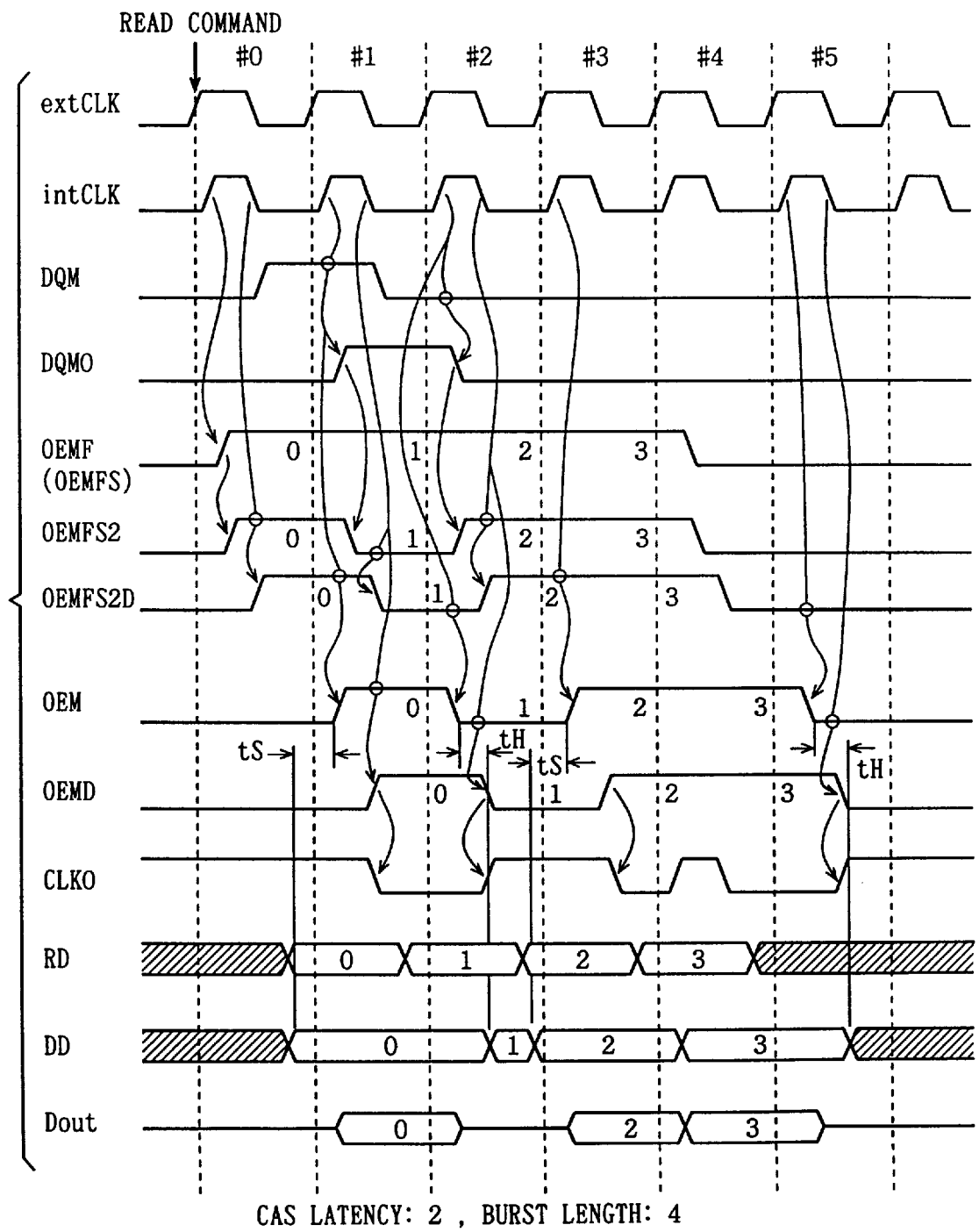
FIG. 15 is a timing chart representing an operation of the circuit shown in FIG. 14.

In FIG. 14, there are provided with an inverter 1c which inverts internal mask instructing signal DQM0 from internal mask instructing signal generating circuit 1a, and AND circuit 1d which receives the output signal of inverter 1c and output signal OEMFS of (CAS latency−2) clock shifter 1b, and generates output signal OEMFS2 to half-clock shifter 1ea. Structures other than the above are the same as those shown in FIG. 12 merely except for the name of signal applied from half-clock shifter 1ea. An operation of the circuits shown in FIG. 14 will be described below with reference to a timing chart of FIG. 15.

In clock cycle #0, the read command is applied, and read enable signal OEMF rises to H-level in synchronization with the rising of internal clock signal intCLK, and maintains H-level until clock cycle #4 because the burst length is 4. Since the CAS latency is 2, signal OEMFS from (CAS latency−2) clock shifter 1b rises to H-level in synchronization with the rising of internal clock signal intCLK so that output signal OEMFS2 of AND circuit 1d rises to H-level. Since signal OEMD is at L-level, internal clock signal CLKO from NAND circuit 1ib in control logic gate 1i maintains H-level, and gate circuit 910a is ON.

In clock cycle #0, signal OEMFS2D generated from half-clock shifter 1ea rises to H-level in synchronization with the rising of internal clock signal intCLK.

In clock cycle #1, externally applied data output mask instruction DQM attains H-level, and internal mask instructing signal DQM0 attains H-level in accordance with the rising of internal clock signal intCLK so that signal OEMFS2 from AND circuit 1d falls to L-level. Half-clock shifter 1ea takes in signal OEMFS2 in synchronization with the falling of internal clock signal intCLK, and drives its output signal OEMFS2D to L-level.

Meanwhile, half-clock shifter 1eb takes in signal OEMFS2D at H-level in synchronization with the rising of internal clock signal intCLK in clock cycle #1, and drives output enable signal OEM to H-level. At this time, internal read data RD has been transmitted to output buffer circuit 910b through on-state gate circuit 910a, and output buffer circuit 910b buffers internal data DD in accordance with active output enable signal OEM to produce output data Dout. In this case, therefore, setup time tS of internal data DD is sufficiently long, similarly to the foregoing embodiment 3, and output data Dout is produced without being accompanied by invalid data.

In clock cycle #1, half-clock shifter 1ec takes in output enable signal OEM at H-level in synchronization with the rising of internal clock signal intCLK, and drives its output signal OEMD to H-level. Signal OEMFS2D has been driven to L-level in synchronization with the falling of internal clock signal intCLK, and NAND circuit 1ib of control logic gate 1i receives signals at H-level on both inputs, and fixes internal clock signal CLKO at L-level.

In clock cycle #2, internal mask instructing signal DQM0 falls to L-level in synchronization with the rising of internal clock signal intCLK (externally applied output mask instruction DQM instructs only the masking for the second output data). In response to the falling of internal mask instructing signal DQM0, signal OEMFS2 from AND circuit id rises to H-level. Subsequently, signal OEMFS2D from half-clock shifter 1ea rises to H-level in synchronization with the falling of internal clock signal intCLK, and NAND circuit 1ia of control logic gate 1i operates as an inverter.

In clock cycle #2, half-clock shifter 1eb likewise takes in signal OEMFS2D at L-level in synchronization with the rising of internal clock signal intCLK so that output enable signal OEM is driven to L-level, and output buffer circuit 910b attains the output high-impedance state. In this clock cycle #2, internal clock signal CLKO for output is fixed at L-level while internal clock signal intCLK is at H-level, and therefore gate circuit 910a is in the latching state. Subsequently, signal OEMD from half-clock shifter 1ec falls to L-level in synchronization with the falling of internal clock signal intCLK, and internal clock signal CLKO attains H-level. When output enable signal OEM changes to the inactive state of L-level in clock cycle #2, internal data DD is therefore in the latched state for a period equal to half the clock cycle of internal clock signal intCLK. Accordingly, internal data DD has sufficiently long hold time tH with respect to output enable signal OEM. Consequently, it is possible to prevent output of invalid data at the time of transition to the masked state.

When internal clock signal CLKO rises to H-level, gate circuit 910a is turned on to transmit internal read data RD(1) to output buffer circuit 910b. In this state, however, output enable signal OEM is already driven to L-level, output buffer circuit 910b is in the output high-impedance state, and data DD(1) thus transmitted is not output. Subsequently, new internal read data RD is transmitted and becomes definite in clock cycle #2. Internal clock signal CLKO is at H-level, and gate circuit 910a is ON so that read data RD(2) is transmitted to output buffer circuit 910b.

In clock cycle #3, half-clock shifter 1eb takes in signal OEMFS2D at H-level in synchronization with the rising of internal clock signal intCLK so that output enable signal OEM rises to H-level, and signal OEMD from half-clock shifter 1ec subsequently rises to H-level in synchronization with the falling of internal clock signal intCLK. At the time of transition of output enable signal OEM to the active state, therefore, internal read data RD(2) is already transmitted, as data DD(2), to output buffer circuit 910b so that setup time tS is sufficiently long. Therefore, internal data DD(2) is buffered without being accompanied by invalid data, and output data Dout(2) is output.

In subsequent clock cycle #4, the burst length period expires so that signals OEMF and OEMFS fall to L-level. When signal OEMFS2 subsequently falls to L-level, signal OEMFS2D also falls to L-level in synchronization with the falling of internal clock signal intCLK, and the output signal of NAND circuit 1*ia* is fixed to H-level. In clock cycle #4, both signals OEMFS2D and OEMD are at L-level while internal clock signal intCLK is at H-level, so that internal clock signal CLKO is generated in accordance with internal clock signal intCLK, and internal read data RD is transmitted to output buffer circuit 910b for output. When internal clock signal intCLK falls to L-level, signal OEMFS2D attains L-level, and NAND circuit 1*ib* receives H-level signals at both the inputs thereof and fixes internal clock signal CLKO to H-level. Thereby, gate circuit 910a attains the latching state.

In clock cycle #5, half-clock shifter 1*eb* takes in signal OEMFS2D at L-level in synchronization with the rising of internal clock signal intCLK, and lowers output enable signal OEM to L-level. At this time, internal clock signal CLKO is still at L-level, and gate circuit 910a is in the latching state. When internal clock signal intCLK falls to L-level, half-clock shifter 1*ec* takes in output enable signal OEM at L-level, and drives its output signal OEMD to L-level. Thereby, internal clock signal CLKO for output is fixed to H-level. At the time of transition of output enable signal OEM to the inactive state, therefore, internal read data DD is in the latched state for a period equal to half the clock cycle so that hold time tH is sufficiently long, and output of invalid data is prevented.

As described above, transfer of the internal read data to the output buffer circuit is not performed in accordance with internal clock signal intCLK with which output enable signal OEM is synchronized. Therefore, the setup time and hold time of the internal data with respect to the output enable signal can be made sufficiently long, and output of invalid data can be prevented. This is owing to the facts that, at the time of transition to the active state of the output enable signal, the internal read data is transmitted to the output buffer circuit prior to at transition, and that the gate circuit is held in the latching state when the output enable signal is deactivated.

Embodiment 5

Figure 16:
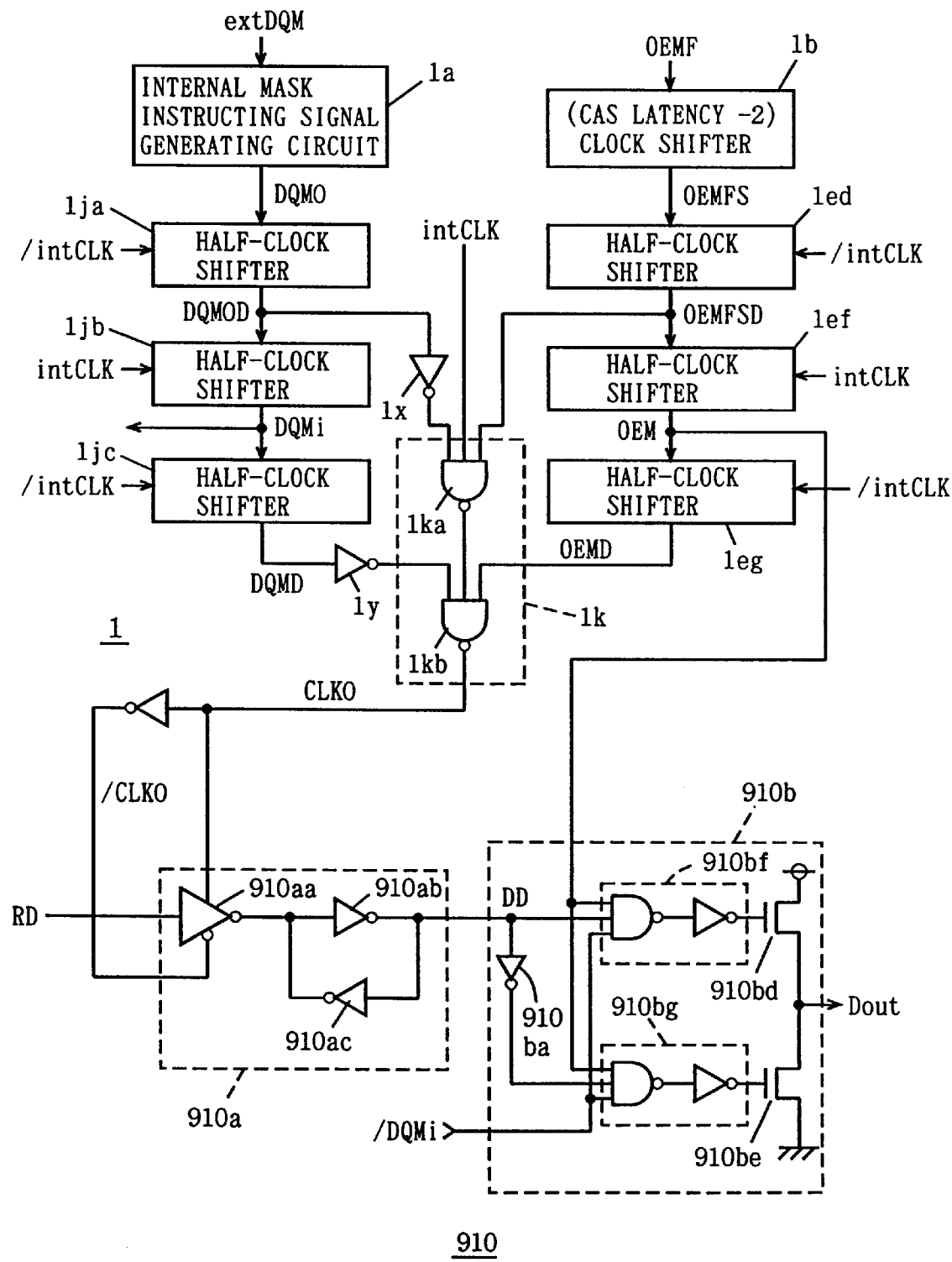
FIG. 16 schematically shows a structure of a main portion of a semiconductor memory device according to an embodiment 5 of the invention.

FIG. 16 shows a structure of a main portion of a semiconductor memory device according to an embodiment 5 of the invention. FIG. 16 likewise shows structures of data output control circuit 1 and output circuit 910. Similarly to data output control circuit 1 shown in FIG. 12, data output control circuit 1 shown in FIG. 16 includes (CAS latency–2) clock shifter 1*b* which delays read enable signal OEMF by (CAS latency–2) clock cycle(s), half-clock shifter 1*ed* which delays output signal OEMFS of (CAS latency–2 clock shifter 1*b* by half the clock cycle, half-clock shifter 1*ef* which further delays output signal OEMFSD of half-clock shifter 1*ed* by half the clock cycle, and half-clock shifter 1*eg* which further delays output signal OEM of half-clock shifter 1*ef* by half the clock cycle. Half-clock shifters 1*ed* and 1*eg* take in and latch the applied the signals in accordance with complementary internal clock signal /intCLK. Half-clock shifter 1*ef* takes in and latches the applied signal in accordance with internal clock signal intCLK.

Data output control circuit 1 further includes internal mask instructing signal generating circuit 1*a* which produces internal mask instructing signal DQM0 in accordance with an externally applied data output mask instruction extDQM, a half-clock shifter 1*ja* which delays internal mask instruction DQM0 from internal mask instructing signal generating circuit 1*a* by half the clock cycle, and half-clock shifter 1*jc* which further delays output signal DQMi of half-clock shifter 1*jb* by half the clock cycle. Half-clock shifters 1*ja* and 1*jc* take in the applied signals in accordance with complementary internal clock signal /intCLK, and half-clock shifter 1*jb* takes in and latches the received signal in accordance with internal clock signal intCLK.

Data output control circuit 1 further includes a control logic gate 1*k* which produces internal clock signal CLKO for data output in accordance with signal OEMFSD from half-clock shifter 1*ed*, output signal DQM0D of half-clock shifter 1*ja* and output signal DQMD of half-clock shifter 1*ac*.

Control logic gate 1*k* includes an NAND circuit 1*a* which receives internal clock signal intCLK, output signal OEMFSD of half-clock shifter 1*ed* and output signal DQM0D applied through an inverter 1*x* from half-clock shifter 1*ja*, and an NAND circuit 1*kb* which receives output signal OEMD of half-clock shifter 1*eg*, the output signal of NAND circuit 1*ka* and output signal DQMD applied through an inverter 1*y* from half-clock shifter 1*jc*, and produces internal clock signal CLKO for data output. Internal clock signal CLKO is inverted by the inverter to form complementary clock signal /CLKO, which controls on/off of tristate inverter buffer 910aa included in gate circuit 910a.

Gate circuit 910a has a structure similar to that in the prior art. Output buffer circuit 910b includes an inverter 910ba inverting the output signal of gate circuit 910a, an AND circuit 910bf receiving output enable signal OEM from half-clock shifter 1*ef*, internal mask instruction DQMi from half-clock shifter 1*jb* and the output signal of gate circuit 910a, an AND circuit 910bg receiving output enable signal OEM, internal data output mask instruction DQMi and the output signal of inverter 910ba, an n-channel MOS transistor 910bd which is turned on to produce output signal Dout at H-level (power supply voltage level) when the output signal of AND circuit 910bf is at H-level, and an n-channel MOS transistor 910be which is turned on to produce output signal Dout at the ground voltage level when the output signal of AND circuit 910bg is at H-level.

Output buffer circuit 910b produces output data Dout in accordance with the data applied from gate circuit 910a when output enable signal OEM is active and internal data output mask instruction DQMi is inactive. In the structure of data output control circuit 1 shown in FIG. 16, internal mask instructing signal DQMi and output enable signal OEM are formed through different paths, and the output impedance of output buffer circuit 910b is controlled in accordance with output enable signal OEM and internal data output mask instruction DQMi.

Figure 17:
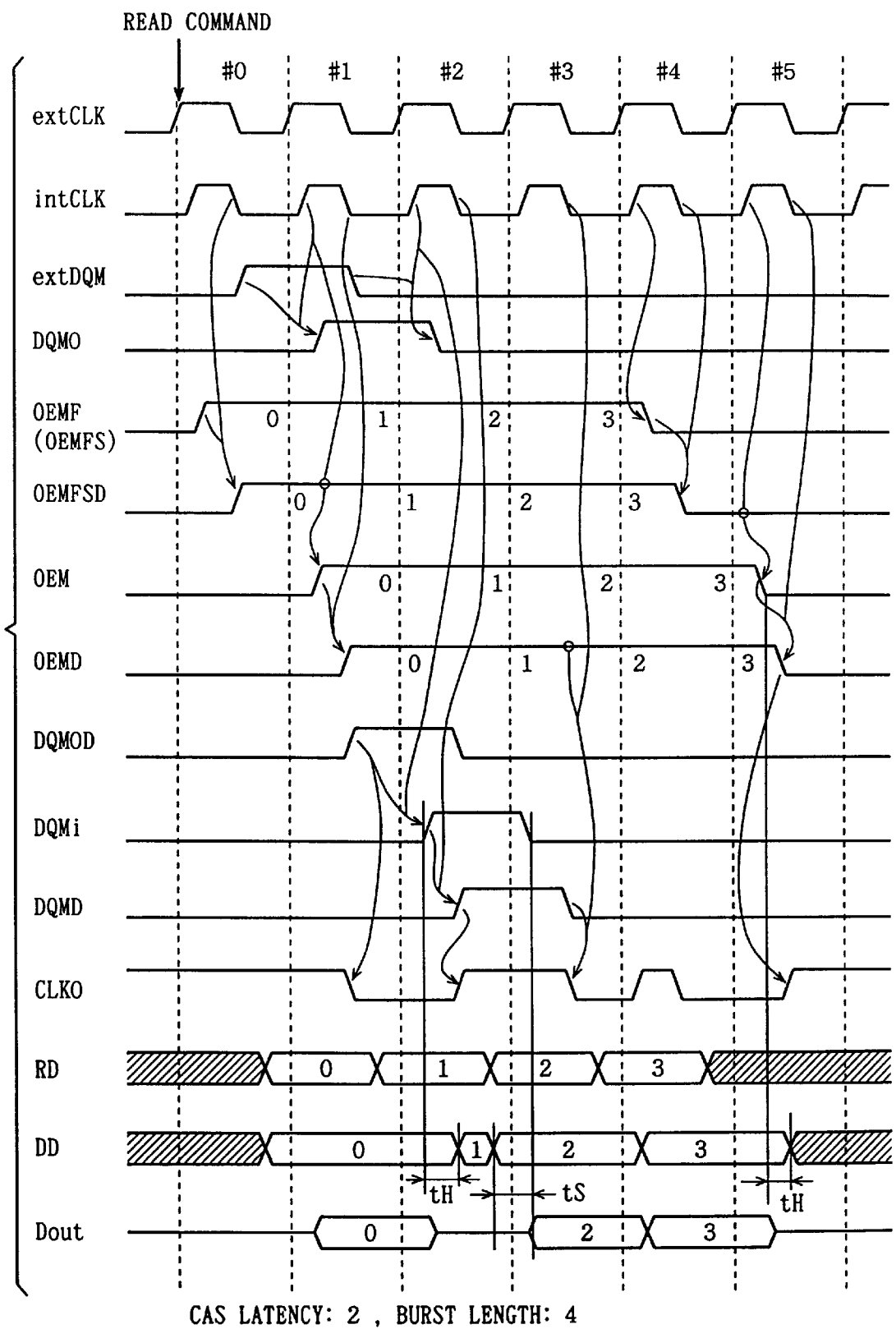
FIG. 17 is a timing chart representing an operation of the circuit shown in FIG. 16.

Internal control gate 1*k* sets gate circuit 910a to the latching state at the time of transition of output buffer circuit 910b to the output high-impedance state, and sets gate circuit 910a to the on state at a fast timing at the time of transition to the output low-impedance state. Now, it increases the setup time and hold time. Then, operations of data output control circuit 1 and output circuit 910 shown in FIG. 16 will be described below with reference to a timing chart of FIG. 17. FIG. 17 likewise represents the data read operation in the case where CAS latency is 2, and the burst length is 4.

A read command is applied in clock cycle #0, and internal read enable signal OEMF rises to H-level in synchronization with the rising of internal clock signal intCLK. Also, signal OEMFS from (CAS latency–2) clock shifter 1b rises to H-level. Then, output signal OEMFSD from half-clock shifter 1ed rises to H-level in synchronization with the falling of internal clock signal intCLK. In accordance with activation of read enable signal OEMF, selection of a memory cell and reading of data are internally performed.

In clock cycle #1, externally applied data output mask instruction extDQM attains H-level, and signal DQM0 from internal mask instructing signal generating circuit 1a rises to H-level in synchronization with the rising of internal clock signal intCLK. Output enable signal OEM from half-clock shifter 1ef changes to the active state of H-level in synchronization with the rising of internal clock signal intCLK, and signal OEMD from half-clock shifter 1eg rises to H-level in synchronization with the falling of internal clock signal intCLK. When signal OEMD rises to H-level, signal DQM0D from half-clock shifter 1ja is already at H-level, and the output signal of inverter 1x attains L-level so that the output signal of NAND circuit 1ka is at H-level. Signal DQMD from half-clock shifter 1ac is still at L-level, and the output signal of inverter 1y is at H-level. Therefore, output signal CLKO of NAND circuit 1kb falls to L-level in response to the rising of signal OEMD. Thereby, internal read data RD read in clock cycle #1 is taken into and latched by gate circuit 910a.

Since output enable signal OEM is at H-level and internal read data output mask instruction DQMi is at L-level, output buffer circuit 910b produces output data Dout in accordance with data DD applied through gate circuit 910a. At the time of transition of output enable signal OEM to the active state, internal read data RD is already transferred by gate circuit 910a to output buffer circuit 910b in accordance with internal clock signal CLKO at H-level, and a sufficient setup time is provided so that only valid data is output without outputting invalid data.

During a period of one clock cycle for which signal DQM0D from half-clock shifter 1ja is at H-level, the output signal of inverter 1x is at L-level, and therefore the output signal of NAND circuit 1ka is at H-level so that internal clock signal CLKO for output maintains L-level until output signal DQMD of half-clock shifter 1jc rises to H-level. In this state, therefore, gate circuit 910a holds the latching state, and internal read data RD which is transmitted in clock cycle #2 will not be transferred during this period.

In synchronization with the falling of internal clock signal intCLK in clock cycle #2, output signal DQMD of half-clock shifter 1jc rises to H-level. Thereby, the output signal of inverter 1y attains L-level, and output signal CLKO of NAND circuit 1kb attains H-level so that gate circuit 910a is turned on, and read data RD is transmitted to output buffer 910b. At this time, however, signal DQMi from half-clock shifter 1jb rises to H-level, and complementary mask signal /DMQi attains L-level in synchronization with the rising of internal clock signal intCLK. Therefore, output buffer circuit 910b attains the output high-impedance state so that this invalid data DD(1) is not output.

In clock cycle #3, signal DQMi from half-clock shifter 1jb falls to L-level, and complementary internal mask signal /DQMi attains H-level in synchronization with the rising of internal clock signal intCLK so that output buffer circuit 910b attains the output low-impedance state again. At this time, internal clock signal CLKO is already at H-level attained according to signal DQMD and in synchronization with the falling of internal clock signal intCLK in clock cycle #2, and this H-level state is maintained until falling of internal clock signal intCLK in clock cycle #3. Therefore, internal read data RD is already transmitted to output buffer circuit 910b before falling of signal DQMi. Accordingly, a sufficiently long setup time is kept, and valid data is output without outputting invalid data.

In clock cycle #4, both signals DQM0D and DQMD attain L-level, and signal OEMD is at H-level. Therefore, internal clock signal CLKO for output is produced in accordance with internal clock signal intCLK, and internal read data RD(3) is applied to output buffer circuit 910b through gate circuit 910a. Responsively, last data Dout(3) is output.

In clock cycle #5, output enable signal OEM falls to L-level in synchronization with the rising of internal clock signal intCLK, and output buffer circuit 910b attains the high-impedance state. At this time, signal OEMFSD has already fallen to L-level in synchronization with the falling of internal clock signal intCLK in clock cycle #4, and the output signal of NAND circuit 1ka of control logic gate 1k has already attained H-level so that the output signal of NAND circuit 1kb is already at L-level. Therefore, gate circuit 910a is in the latching state.

Internal clock signal CLKO for output returns to H-level when signal OEMD falls to L-level, in synchronization with the falling of internal clock signal intCLK in clock cycle #5. For a period equal to half the clock cycle of internal clock signal intCLK, gate circuit 910a is in the latching state, and hold time tH of internal data DD during the inactive state of output enable signal OEM is sufficiently long. Accordingly, output of invalid data is prevented.

According to the embodiment 5, as described above, output enable signal OEM and internal data mask instruction DQMi are produced through different paths, and the output impedance is controlled in the output buffer circuit in accordance with both the signals. The gate circuit is turned on, at the time of transition to the data output enabling, to transfer the data to the output buffer circuit prior to that transition. At the time of transition from the data output enabling to the data output disabling, the gate circuit is held at the latching state. Signals shifted in phase by half the clock cycle from the output enable signal and the internal data output mask instructing signal respectively are used for controlling on/off of the gate circuit in this manner. Accordingly, the setup time and hold time of the internal data signal can be made sufficiently long, and therefore the output circuit which does not output invalid data can be implemented.

Embodiment 6

Figure 18:
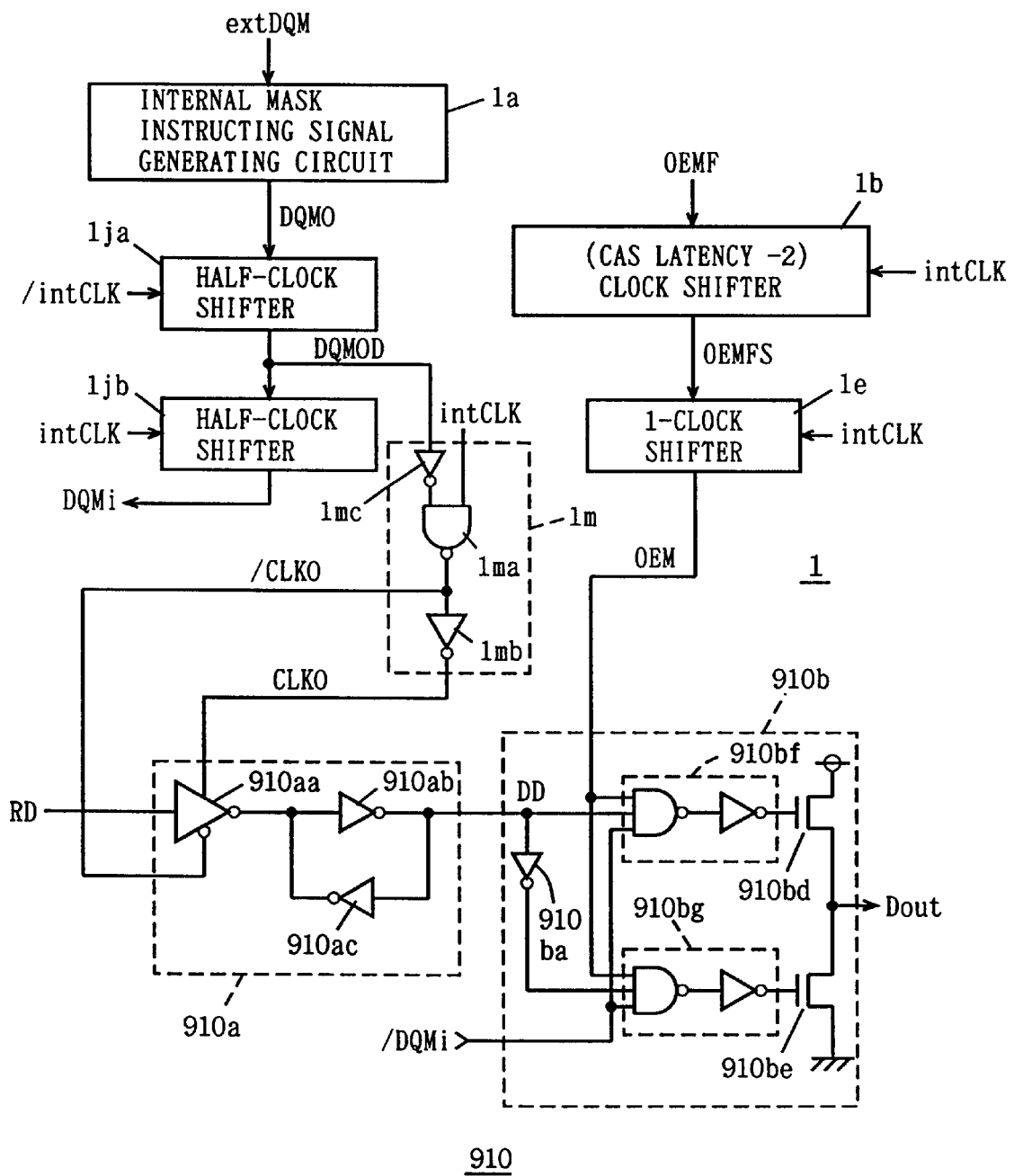
FIG. 18 schematically shows a structure of a main portion of a semiconductor memory device according to an embodiment 6 of the invention.

FIG. 18 shows a structure of a main portion of a semiconductor memory device according to an embodiment 6 of the invention. FIG. 18 likewise shows structures of data output control circuit 1 and output circuit 910. In FIG. 18, data output control circuit 1 includes (CAS latency–2) clock shifter 1b which delays read enable signal OEMF by (CAS latency–2) clock cycle(s), a one-clock shifter 1e which delays an output signal OEMFS of (CAS latency–2) clock shifter 1b to produce output enable signal OEM, internal mask instructing signal generating circuit 1a which produces internal mask instructing signal DQM0 in accordance with externally applied data output mask instruction extDQM, a half-clock shifter 1ja which delays internal mask instructing signal DQM0 by half the clock cycle of clock signal intCLK, a half-clock shifter 1jb which delays output signal DQM0D of half-clock shifter 1ja by half the clock cycle of internal clock signal to produce internal data output mask instruction DQMi, and a control logic gate 1m which produces internal clock signals CLKO and /CLKO for data output in accordance with output signal DQM0D of half-clock shifter 1ja and internal clock signal intCLK.

This control logic gate 1m includes a NAND circuit 1ma which receives signal DQM0D applied through an inverter 1mc and internal clock signal intCLK, and produces complementary internal clock signal /CLKO for output, and in inverter 1mb which inverts the output signal of NAND circuit 1ma to produce internal clock signal CLKO for output.

Output circuit 910 includes gate circuit 910a which selectively attains the on state and the latching state in accordance with internal clock signals CLKO and /CLKO for output, and output buffer circuit 910b which has the output impedance controlled in accordance with output enable signal OEM and internal data output mask instruction /DQMi, and outputs internal data DD from gate circuit 910a. Gate circuit 910a and output buffer circuit 910b have the same structures as those shown in FIG. 16, and corresponding portions bear the same reference numerals.

Output buffer circuit 910b receives internal data output mask instruction /DQMi and output enable signal OEM. However, the same structure as that shown in FIG. 5 may be employed, wherein one-clock shifter 1e receives the output signal of the AND circuit receiving the output signal OEMFS of (CAS latency–2) clock shifter 1b and internal mask instructing signal DQM0.

Figure 19:
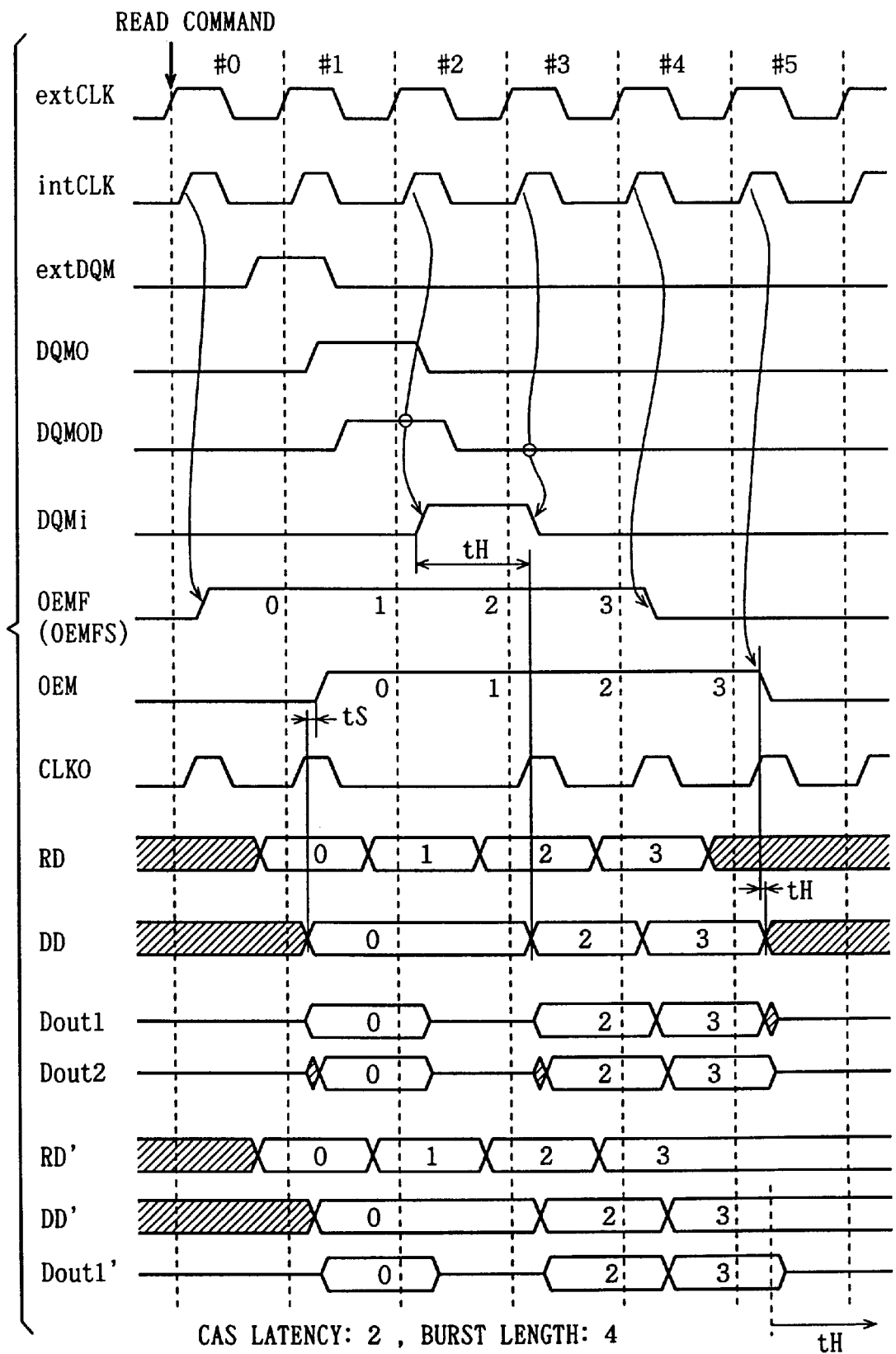
FIG. 19 is a timing chart representing an operation of the circuit shown in FIG. 18.

In the data output control circuit 1 shown in FIG. 18, control logic gate 1m stops generation of internal clock signal CLKO for output in accordance with data mask instructing signal DQM0D. Therefore, production of internal clock signal CLKO stops only while masking is performed, to enter gate circuit 910a into the latch state. An operation of the circuit shown in FIG. 18 will be described below with reference to a timing chart of FIG. 19. FIG. 19 represents the operation performed with the CAS latency of 2 and the burst length of 4.

In clock cycle #0, the read command is applied, read enable signal OEMF rises to H-level in synchronization with the rising of internal clock signal intCLK, and output signal OEMFS of (CAS latency–2) clock shifter 1b also rises to H-level. Since internal mask instructing signal DQM0 is at L-level or inactive, signal DQM0D is at L-level, and internal clock signals CLKO and /CLKO for output are produced in accordance with internal clock signal intCLK. In clock cycle #0, data is read from a selected memory cell.

In clock cycle #1, externally applied mask instruction extDQM attains H-level, and internal mask instructing signal DQM0 attains H-level for one clock cycle period in synchronization with the rising of internal clock signal intCLK (the data output mask is applied only in clock cycle #1). Then, output signal DQM0D of half-clock shifter 1ja rises to H-level in synchronization with internal clock signal intCLK. Thereby, the output signal of NAND circuit 1ma included in control logic gate 1m attains H-level, and output signal CLKO of inverter 1mb attains L-level so that gate circuit 910a attains the latching state. In this clock cycle #1, output enable signal OEM rises to H-level in synchronization with the rising of internal clock signal intCLK, and output data Dout is produced in accordance with internal data DD transmitted from gate circuit 910a.

In clock cycle #2, internal data output mask instruction DQMi attains H-level in synchronization with the rising of internal clock signal intCLK, and output buffer circuit 910b attains the output high-impedance state. In this state, internal clock signal CLKO for output holds L-level, and therefore gate circuit 910a holds the latching state so that hold time tH of internal data DD at the time of transition of output buffer circuit 910b to the output high-impedance state is equal to one clock cycle period and is sufficiently long, resulting in prevention of output of invalid data. In clock cycle #2, output signal DQM0D of half-clock shifter 1ja attains L-level in synchronization with the falling of internal clock signal intCLK so that control logic gate 1m produces internal clock signals CLKO and /CLKO in accordance with internal clock signal intCLK.

In clock cycle #3, internal data output mask instruction DQMi attains L-level in synchronization with the rising of internal clock signal intCLK, and output buffer circuit 910b produces output data Dout in accordance with applied internal data DD.

In clock cycle #4, the burst length period expires, and read enable signal OEMF falls to L-level in synchronization with the rising of internal clock signal intCLK. Also, output signal OEMFS of (CAS latency–2) clock shifter 1b falls to L-level. At this time, output enable signal OEM is still at H-level, and internal clock signal CLKO is produced. Therefore, internal read data RD(3) is applied to output buffer circuit 910b through gate circuit 910a in accordance with clock signal CLKO, and data DD(3) which is the last in the burst length is produced as the output data.

In next clock cycle #5, output enable signal OEM falls to L-level in synchronization with the rising of internal clock signal intCLK, and output buffer circuit 910b attains the output high-impedance state.

Setup time tS of internal data DD with respect to output enable signal OEM can be sufficiently increased by setting the delay time of one-clock shifter 1e (gate delay of the counter) to be longer the delay time of control logic gate 1m and the delay time of gate circuit 910a. However, this arrangement would reduce hold time tH of internal data DD at the time of transition of output enable signal OEM to the inactive state, and therefore invalid data may be output together with output data Dout1 in FIG. 19 at the time of transition to the output high-impedance state. Meanwhile, if setup time tS is reduced, hold time tH increases, and invalid data is not output at the time of transition of output enable signal OEM to the inactive state. However, reduced setup time tS may cause output of invalid data as can be seen from data Dout2 in FIG. 19. For preventing this, internal read data RD' is held in the latched state when the last data in the burst length is output. In this case, sufficiently long setup time tS may be employed. In other words, such a structure may be employed that internal clock signal CLKO for data output rises to H-level at a fast timing relative to activation of output enable signal OEM, to make conductive gate circuit 910a. Since hold time tH is sufficiently long, invalid data is not output according to this structure as can be seen from internal data DD' and output data Dout1'. For internal data DD', internal clock signal CLKO is produced, and latched read data RD'(3) is repetitively applied. Thus, the same data is continuously applied as internal data DD' so that hold time tH can be increased.

Figure 20:
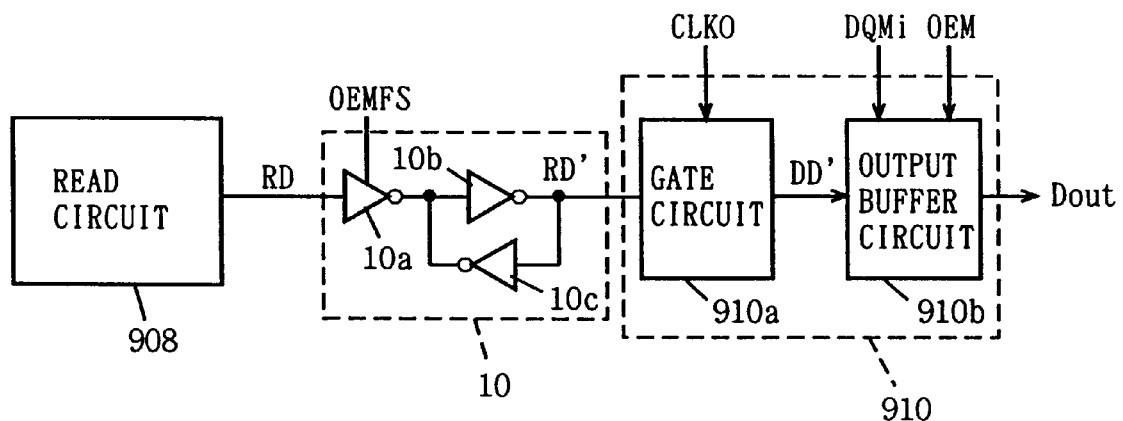
FIG. 20 schematically shows a structure of a circuit for achieving the latch shown in the operation waveform diagram of FIG. 19.
Figure 21:
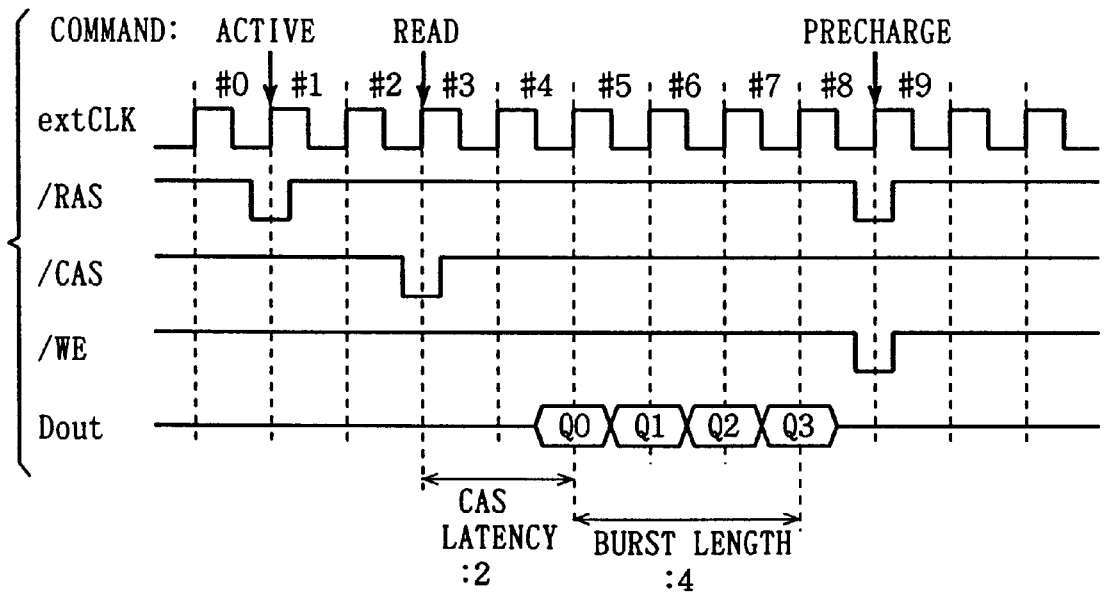
FIG. 21 is a timing chart representing a data read operation of a synchronous semiconductor memory device in the prior art.
Figure 22:
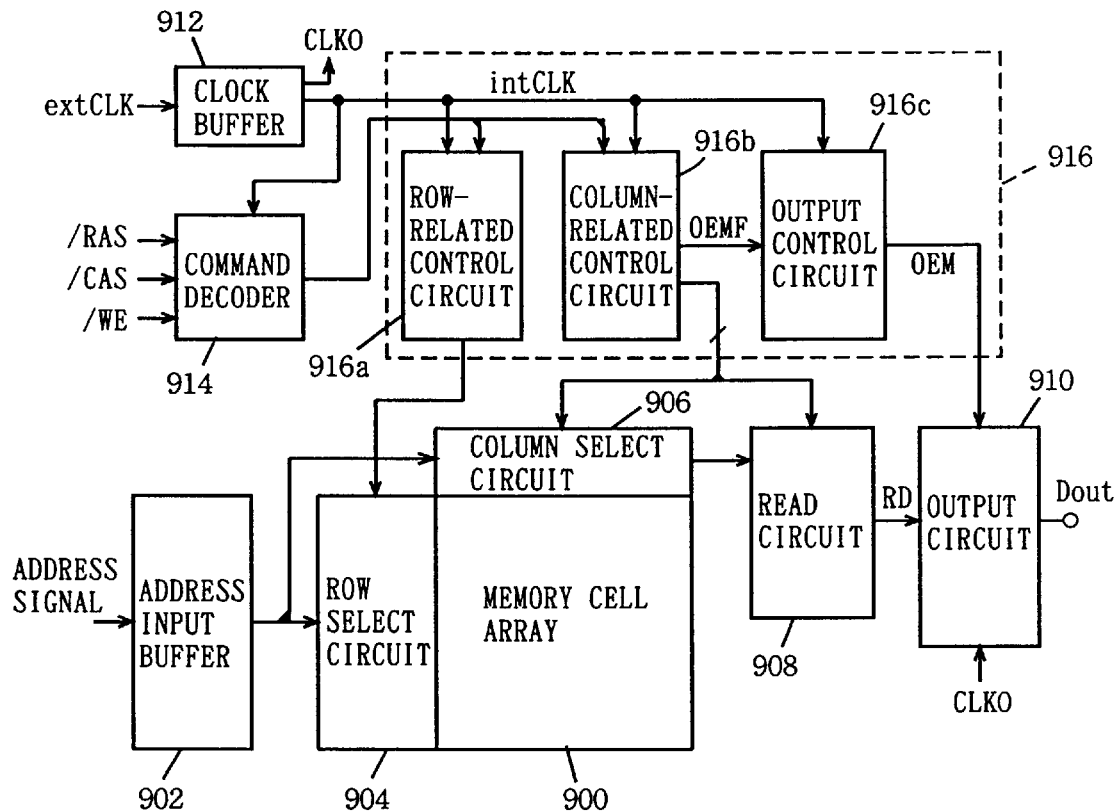
FIG. 22 schematically shows a whole structure of the synchronous semiconductor memory device in the prior art.
Figure 23:
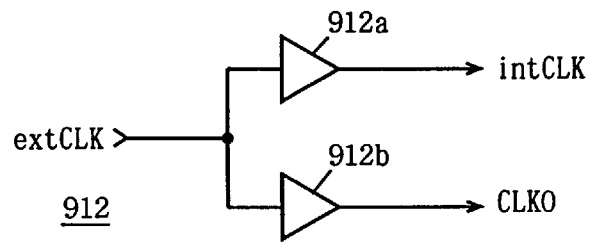
FIG. 23 schematically shows a structure of a clock buffer shown in FIG. 22.

FIG. 20 shows a structure of a portion for producing internal read data RD' and internal data DD'.

In FIG. 20, a transfer circuit 10 which attains the on state and the latching state in accordance with signal OEMFS is arranged between read circuit 908 and output circuit 910. Transfer circuit 10 includes a tristate inverter buffer 10a which inverts internal read data RD from read circuit 908 when signal OEMFS is active, inverter 10*b* which inverts the output signal of tristate inverter buffer 10*a* and produces internal read data RD', and an inverter 10*c* which inverts output signal RD' of inverter 10*b* for transmission to the input of inverter 10*b*. Inverters 10*b* and 10*c* form an inverter latch.

According to the structure shown in FIG. 20, transfer circuit 10 produces read data RD' in accordance with internal read data RD applied in clock cycles #0 through #4 as shown in a signal waveform diagram of FIG. 19, and applies the produced read data RD' to gate circuit 910*a* of output circuit 910. When signal OEMFS is at L-level or inactive, tristate inverter buffer 10*a* attains the output high-impedance state, and transfer circuit 10 attains the latching state. When signal OEMFS falls to L-level in synchronization with rising of internal clock signal intCLK in clock cycle #4, currently applied internal read data RD(3) is kept in the latched state, and the hold time of internal data DD' with respect to the falling of output enable signal OEM can be made sufficiently long. Since signal OEMFS precedes output enable signal OEM by one clock cycle, hold time tH of internal data DD' at the time of deactivation of output enable signal OEM can be sufficiently long even if setup time tS of internal data DD' with respect to output enable signal OEM is sufficiently increased. Therefore, output of invalid data can be prevented.

Instead of the structure shown in FIG. 20, such a structure may be employed that a preamplifier which drives the internal read data bus at the last stage of read circuit 908 has a latching function. This is implemented by employing such a structure that the preamplifier is reset and the internal read data bus line is precharged to a predetermined voltage level only when a precharge command is applied. The latching structure shown in FIG. 20 is merely an example, and transfer circuit 10 may be included in read circuit 908. Any structure may be employed provided that the last data in burst length is latched.

According to the embodiment 6 of the invention, generation of the internal clock signal for output is stopped in accordance with the internal data mask instruction, output of invalid data at the time of masking of data output can be prevented. In particular, by latching the last data in burst length, both the setup time and the hold time can be made sufficiently long, and output of invalid data can be reliably prevented.

According to the invention, as described above, generation of the clock signal applied to the gate circuit transmitting the internal data to the output buffer circuit is controlled such that the definite and valid data can always be applied reliably to the output buffer circuit at the time of transition to the data output enabled or disabled state. Therefore, external generation of invalid data can be reliably prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cells each for storing data;
a gate circuit for passing therethrough data of a memory cell selected among said plurality of memory cells in a data read mode of operation;
an output circuit for externally outputting the data applied from said gate circuit when data output is enabled; and
an output control circuit for making conductive said gate circuit in synchronization with a clock signal, said output control circuit including means for making non-conductive said gate circuit regardless of a logic state of the clock signal in response to a designation of disabling of the data output through said output circuit.

2. The semiconductor memory device according to claim 1, wherein
said output control circuit includes:
means for activating a data output enable signal in response to a data read instruction instructing said data read mode of operation, and
a control logic receiving said data output enable signal and said clock signal, for making conductive said gate circuit in synchronization with said clock signal during an active state of said data output enable signal.

3. The semiconductor memory device according to claim 2, wherein
said output control circuit further includes a delay circuit for delaying said data output enable signal by a predetermined period for application to said output circuit for activating said output circuit during an active state of the delayed data output enable signal.

4. The semiconductor memory device according to claim 2, wherein
said output control circuit further includes means for deactivating said data output enable signal in response to a read mask instruction for masking the output of data of the selected memory cell said output circuit.

5. The semiconductor memory device according to claim 1, wherein
said output control circuit includes:
means for activating a read enable signal in response to a data read instruction designating said data read mode of operation;
a first delay circuit for delaying said read enable signal by a predetermined time;
a control logic receiving an output signal of said first delay circuit and said clock signal, for making conductive said gate circuit in synchronization with said clock signal during an active state of said output signal of said first delay circuit; and
a second delay circuit for delaying the output signal of said first delay circuit for application to said output circuit, to activate said output circuit during an active state of an output signal of said second logic circuit, to externally output the data received from said gate circuit.

6. The semiconductor memory device according to claim 5, wherein
said output control circuit further includes means for deactivating the read enable signal to be applied to said first delay circuit in response to activation of a mask instruction for masking the output of data of the selected memory cell from said output circuit.

7. The semiconductor memory device according to claim 1, wherein
said output control circuit includes:
means for activating a read enable signal in response to a data read instruction designating said data read mode of operation;
delay means for delaying said read enable signal to generate a first delayed signal having a first delay time, a second delayed signal having a second delay time longer than said first delay time and applied to said output circuit, and a third delayed signal having a third delay time longer than said second delay time in synchronization with said clock signal; and a control logic receiving the first and third delayed signals and said clock signal, and making conductive said gate circuit in synchronization with said clock signal during an active state of said first and third delayed signals.

8. The semiconductor memory device according to claim 7, wherein said delay means includes a delay circuit operating in synchronization with said clock signal to delay said read enable signal by half a cycle, one cycle and one-and-half a cycle of said clock signal for producing the first, second and third delayed signals, respectively.

9. The semiconductor memory device according to claim 8, wherein said output control circuit further includes means for deactivating the read enable signal to be applied to said delay means in response to a mask instruction for masking an external output of data of the selected memory cell from said output circuit.

10. The semiconductor memory device according to claim 1, wherein said output control circuit includes;
means for generating a read enable signal in response to a data read instruction designating said data read mode of operation,
read delay circuitry for delaying said read enable signal to generate a first delayed read signal having a first delay time, a second delayed read signal having a second delay time longer than said first delay time, and a third delayed read signal having a third delay time longer than said second delay time,
means for generating an internal mask instructing signal in response to a mask instruction for masking the output of the selected memory cell from said output circuit,
mask delaying means for receiving said internal mask instructing signal, for generating first, second and third delayed mask instructing signals having the first, second and third delay times, respectively, and
a control logic receiving said first delayed read signal, said first delayed mask instructing signal and said clock signal, for making conductive said gate circuit in synchronization with said clock signal during an active state of said first delayed read signal and during an inactive state of said first delayed mask instructing signal.

11. The semiconductor memory device according to claim 10, wherein said output circuit includes:

means responsive to an active state of said second delayed read signal and an inactive state of said second delayed mask instructing for signal externally outputting the data of the selected memory cell applied from said gate circuit.

12. The semiconductor memory device according to claim 10, wherein said control logic includes;

a control logic gate for receiving said third delayed read signal and said third delayed mask instructing signal, and responsive to the active state of said third delayed read signal and the inactive state of said third delayed mask instructing signal for applying the output signal of said control logic to said gate circuit, and otherwise invalidating the output signal of said control logic to making conductive said gate circuit.

13. The semiconductor memory device according to claim 10, wherein said first, second and third delayed time are equal to half a cycle, one cycle and one-and-half a cycle of said clock signal, respectively.

14. The semiconductor memory device according to claim 1, wherein said output control circuit includes:
means responsive to an externally applied data output instruction for generating a read enable signal;
means for delaying said read enable signal to generate an output enable signal;
means for generating an internal mask instructing signal in response to a mask instruction for masking the output of data of the selected memory cell from said output circuit;
delaying means for receiving said internal mask instructing signal, to generate first and second delayed mask instructing signals having a first delay time and a second delay time longer than said first delay time with respect to said internal mask instructing signal, respectively; and
a control logic receiving said first delayed mask instructing signal and said clock signal, for making conductive said gate circuit in synchronization with said clock signal during an inactive state of said first delayed mask instructing signal,
said output circuit is configured to externally output the data applied from said gate circuit in response to the active state of said output enable signal and the inactive state of said second delayed mask instructing signal, and otherwise to attain an output high-impedance state.

15. The semiconductor memory device according to claim 14, wherein said means for generating said output enable signal includes means operating in synchronization with said clock signal, for producing said output enable signal by delaying said read enable signal by a period equal to a predetermined cycle(s) of said clock signal, and
said delay means includes means for delaying said internal mask instructing signal by periods equal to half a cycle and one cycle of said clock signal to produce said first and second delayed mask instructing signals, respectively.

16. The semiconductor memory device according to claim 1, further comprising:

a data latch provided at a preceding stage with respect to said gate circuit for latching the data to be applied to said gate circuit.

17. The semiconductor memory device according to claim 1, wherein said gate circuit includes a latch for latching received data for application to said output circuit.

18. The semiconductor memory device according to claim 1, wherein said semiconductor memory device is configured to operate in synchronization with said clock signal for inputting and outputting data.

19. The semiconductor memory device according to claim 1, wherein said output control circuit includes means for making conductive said gate circuit at a timing faster than enabling of said output circuit.

20. The semiconductor memory device according to claim 1, wherein said output control circuit includes means for making non-conductive said gate circuit at a timing faster than the deactivation of said output circuit.

* * * * *